(12) United States Patent
Heo et al.

(10) Patent No.: US 12,317,727 B2
(45) Date of Patent: May 27, 2025

(54) SENSOR-EMBEDDED DISPLAY PANEL AND ELECTRONIC DEVICE

(71) Applicant: Samsung Electronics Co., Ltd., Suwon-si (KR)

(72) Inventors: Chul Joon Heo, Busan (KR); Kyung Bae Park, Hwaseong-si (KR); Sung Young Yun, Suwon-si (KR); Hyeongju Kim, Changwon-si (KR); Feifei Fang, Suwon-si (KR); Hwijoung Seo, Hwaseong-si (KR); Juhyung Lim, Suwon-si (KR); Taejin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 600 days.

(21) Appl. No.: 17/696,272

(22) Filed: Mar. 16, 2022

(65) Prior Publication Data
US 2022/0392972 A1     Dec. 8, 2022

(30) Foreign Application Priority Data
May 28, 2021   (KR) .................. 10-2021-0069460

(51) Int. Cl.
*H01L 29/08*       (2006.01)
*H10K 39/32*       (2023.01)
(Continued)

(52) U.S. Cl.
CPC ............ *H10K 59/60* (2023.02); *H10K 39/32* (2023.02); *H10K 50/11* (2023.02); *H10K 59/353* (2023.02); *H10K 2101/40* (2023.02)

(58) Field of Classification Search
CPC ...... H10K 59/60; H10K 59/353; H10K 39/32; H10K 50/11; H10K 2101/14
(Continued)

(56) References Cited

U.S. PATENT DOCUMENTS 9,548,463 B2   1/2017   Yagi et al.
9,673,259 B2   6/2017   Park et al.
(Continued)

FOREIGN PATENT DOCUMENTS

JP   2018-129505 A       8/2018
JP   2018143025 A  *    9/2018
(Continued)

OTHER PUBLICATIONS

Extended European Search Report dated Nov. 10, 2022 for corresponding European Application No. 22174568.0.

*Primary Examiner* — Phuc T Dang
(74) *Attorney, Agent, or Firm* — Harness, Dickey & Pierce, P.L.C.

(57) ABSTRACT

A sensor-embedded display panel includes a substrate, a light emitting element on the substrate and including a light emitting layer, and a photosensor on the substrate and including a photoelectric conversion layer in parallel with the light emitting layer along an in-plane direction of the substrate, wherein the light emitting element and the photosensor each include a separate portion of a first common auxiliary layer that is a single piece of material that extends continuously on the light emitting layer and the photoelectric conversion layer, and a separate portion of a common electrode on the first common auxiliary layer and is configured to apply a common voltage to both the light emitting element and the photosensor, and the photoelectric conversion layer includes a sequential stack from the first common auxiliary layer of a first n-type semiconductor layer, a second n-type semiconductor layer, and a p-type semiconductor layer.

33 Claims, 7 Drawing Sheets

(51) Int. Cl.
*H10K 50/11* (2023.01)
*H10K 59/35* (2023.01)
*H10K 59/60* (2023.01)
*H10K 101/40* (2023.01)

(58) Field of Classification Search
USPC .......................................................... 257/40
See application file for complete search history.

(56) References Cited

U.S. PATENT DOCUMENTS

| | | |
|---|---|---|
| 10,141,376 B2 | 11/2018 | Park et al. |
| 2017/0263669 A1* | 9/2017 | Tamaki ................ H04N 25/709 |
| 2019/0364191 A1 | 11/2019 | Takahashi et al. |
| 2020/0411595 A1* | 12/2020 | Tsutsumi ............. H10K 85/656 |
| 2021/0005669 A1 | 1/2021 | Kamada et al. |
| 2021/0327979 A1 | 10/2021 | Kamada et al. |
| 2022/0115446 A1 | 4/2022 | Kamada et al. |

FOREIGN PATENT DOCUMENTS

| | | |
|---|---|---|
| KR | 2016-0009404 A | 1/2016 |
| WO | WO-2020/053692 A1 | 3/2020 |
| WO | WO-2020/148600 A1 | 7/2020 |

\* cited by examiner

SENSOR-EMBEDDED DISPLAY PANEL AND ELECTRONIC DEVICE

CROSS-REFERENCE TO RELATED APPLICATION

This application claims priority to and the benefit of, under 35 U.S.C. § 119, Korean Patent Application No. 10-2021-0069460 filed in the Korean Intellectual Property Office on May 28, 2021, the entire contents of which are incorporated herein by reference.

BACKGROUND

1. Field

Sensor-embedded display panels and electronic devices are described.

2. Description of the Related Art

Recently, there is an increasing demand for a display device implementing a biometric recognition technology that authenticates the person by extracting specific biometric information or behavioral characteristic information of a person with an automated device centering on finance, healthcare, and mobile.

SUMMARY

Some example embodiments provide a display device (e.g., a display panel) including a sensor capable of biometric recognition.

Such a sensor capable of biometric recognition may be disposed under the display panel or may be separately manufactured as a separate module and mounted outside the display panel. However, when the sensor is disposed under the display panel, the object should be recognized through the display panel, various films, and/or parts, and thus performance may be degraded. When the sensor is separately manufactured and mounted as a separate module, there are limitations in terms of design and usability.

Some example embodiments provide a sensor-embedded display panel including a sensor that is integrated with the display panel to improve performance.

Some example embodiments provide an electronic device including the sensor-embedded display panel.

According to some example embodiments, a sensor-embedded display panel may include a substrate, a light emitting element on the substrate and including a light emitting layer, and a photosensor on the substrate and including a photoelectric conversion layer that is in parallel with the light emitting layer along an in-plane direction of the substrate such that the photoelectric conversion layer and the light emitting layer at least partially overlap in the in-plane direction. The light emitting element and the photosensor may each include a separate portion of a first common auxiliary layer that is a single piece of material that extends continuously on both the light emitting layer and the photoelectric conversion layer, and a separate portion of a common electrode that is on the first common auxiliary layer and is configured to apply a common voltage to both the light emitting element and the photosensor. The photoelectric conversion layer may include a sequential stack from the first common auxiliary layer of a first n-type semiconductor layer, a second n-type semiconductor layer, and a p-type semiconductor layer.

The light emitting element may include first, second and third light emitting elements arranged in parallel along the in-plane direction of the substrate such that the first, second and third light emitting elements at least partially overlap in the in-plane direction, wherein the first, second and third light emitting elements are configured to emit light of different emission spectra in relation to each other, and the photosensor may be configured to convert light emitted from at least one of the first, second, or third light emitting elements and then reflected by a recognition target to an electrical signal.

The photoelectric conversion layer may be configured to absorb light in a red wavelength spectrum, a green wavelength spectrum, a blue wavelength spectrum, or any combination thereof.

At least one of the first n-type semiconductor layer or the second n-type semiconductor layer may form a pn junction with the p-type semiconductor layer.

One of the first n-type semiconductor layer or the second n-type semiconductor layer may include an n-type semiconductor configured to absorb light of a visible light wavelength spectrum, and another one of the first n-type semiconductor layer or the second n-type semiconductor layer may include a transparent n-type semiconductor.

A lowest unoccupied molecular orbital (LUMO) energy level of the first n-type semiconductor layer may be closer to a vacuum level of 0 eV than a LUMO energy level of the second n-type semiconductor layer.

A difference between the LUMO energy level of the first n-type semiconductor layer and a LUMO energy level of the first common auxiliary layer may be smaller than a difference between the LUMO energy level of the second n-type semiconductor layer and the LUMO energy level of the first common auxiliary layer.

The difference between the LUMO energy level of the first n-type semiconductor layer and the LUMO energy level of the first common auxiliary layer may about 0 eV to about 1.0 eV.

The difference between the LUMO energy level of the second n-type semiconductor layer and the LUMO energy level of the first common auxiliary layer may be about 0.5 eV to about 1.2 eV.

A difference between the LUMO energy level of the second n-type semiconductor layer and the LUMO energy level of the first n-type semiconductor layer may be about 0.5 eV to about 1.2 eV.

A thickness of the second n-type semiconductor layer may be smaller than a thickness of the first n-type semiconductor layer.

The thickness of the second n-type semiconductor layer may be about 1 nm to about 10 nm.

The light emitting element may include first, second, and third light emitting elements that are each configured to emit light of any one of a red wavelength spectrum, a green wavelength spectrum, a blue wavelength spectrum, or an infrared wavelength spectrum, and the p-type semiconductor layer may include a p-type semiconductor configured to selectively absorb light of any one of the red wavelength spectrum, the green wavelength spectrum, the blue wavelength spectrum, or the infrared wavelength spectrum.

The first n-type semiconductor layer may include a transparent n-type semiconductor, the second n-type semiconductor layer may include an n-type semiconductor configured to absorb light of a visible light wavelength spectrum, and the p-type semiconductor layer may include a p-type semiconductor configured to selectively absorb light of any one of a red wavelength spectrum, a green wavelength spectrum, a blue wavelength spectrum, or an infrared wavelength spectrum.

The sensor-embedded display panel may further include a second common auxiliary layer that is a single piece of material that extends continuously between the light emitting element and the substrate and between the photosensor and the substrate.

The sensor-embedded display panel may include a display area configured to display a color and a non-display area excluding the display area, and the photosensor may be in the non-display area.

The display area may include a plurality of first subpixels configured to display red and including the first light emitting element, a plurality of second subpixels configured to display green and including the second light emitting element, and a plurality of third subpixels configured to display blue and including the third light emitting element, and the photosensor may be between at least two of a first subpixel of the plurality of first subpixels, a second subpixel of the plurality of second subpixels, or a third subpixel of the plurality of third subpixels in the in-plane direction.

The light emitting layer may include an organic light emitting material, a quantum dot, perovskite, or any combination thereof, and the photoelectric conversion layer may include an organic photoelectric conversion material.

According to some example embodiments, a sensor-embedded display panel may include a display area configured to display a color and a non-display area excluding the display area, wherein the display area includes a first subpixel configured to display a first color and including a first light emitting element, a second subpixel configured to display a second color and including a second light emitting element, and a third subpixel configured to display a third color and including a third light emitting element, the non-display area includes a photosensor that is between at least two of the first subpixel, the second subpixel, or the third subpixel. The first light emitting element, the second light emitting element, the third light emitting element, and the photosensor may share a common electrode that is configured to apply a common voltage to the first light emitting element, the second light emitting element, the third light emitting element, and the photosensor. The photosensor may include a separate portion of the common electrode, a pixel electrode facing the separate portion of the common electrode, and a photoelectric conversion layer that includes a stack of a first n-type semiconductor layer, a second n-type semiconductor layer, and a p-type semiconductor layer between the common electrode and the pixel electrode.

The first n-type semiconductor layer and the second n-type semiconductor layer may each include different materials in relation to each other, and stack may be a sequential stack of the first n-type semiconductor layer, the second n-type semiconductor layer, and the p-type semiconductor layer may be stacked in this order.

A lowest unoccupied molecular orbital (LUMO) energy level of the first n-type semiconductor layer may be closer to a vacuum level of 0 eV than a LUMO energy level of the second n-type semiconductor layer.

The first light emitting element, the second light emitting element, the third light emitting element, and the photosensor may share a first common auxiliary layer that is under the common electrode, the first light emitting element may include a first light emitting layer, the second light emitting element may include a second light emitting layer, the third light emitting element may include a third light emitting layer, and the first light emitting element, the second light emitting element, the third light emitting element, and the photosensor may share a second common auxiliary layer facing the first common auxiliary layer, wherein the first light emitting layer, the second light emitting layer, the third light emitting layer, and the photoelectric conversion layer are between the first common auxiliary layer and the second common auxiliary layer.

A difference between a LUMO energy level of the first n-type semiconductor layer and a LUMO energy level of the first common auxiliary layer may be smaller than a difference between a LUMO energy level of the second n-type semiconductor layer and the LUMO energy level of the first common auxiliary layer.

The difference between the LUMO energy level of the first n-type semiconductor layer and the LUMO energy level of the first common auxiliary layer may be about 0 eV to about 1.0 eV, the difference between the LUMO energy level of the second n-type semiconductor layer and the LUMO energy level of the first common auxiliary layer may be about 0.5 eV to about 1.2 eV, and a difference between the LUMO energy level of the second n-type semiconductor layer and the LUMO energy level of the first n-type semiconductor layer may be about 0.5 eV to about 1.2 eV.

A thickness of the second n-type semiconductor layer may be smaller than a thickness of the first n-type semiconductor layer, and the thickness of the second n-type semiconductor layer may be about 1 nm to about 10 nm.

The first n-type semiconductor layer may include a transparent n-type semiconductor, the second n-type semiconductor layer may include an n-type semiconductor configured to absorb light of a visible light wavelength spectrum, and the p-type semiconductor layer may include a p-type semiconductor configured to selectively absorb light of one of a red wavelength spectrum, a green wavelength spectrum, or a blue wavelength spectrum.

According to some example embodiments, a display device including the sensor-embedded display panel is provided.

According to some example embodiments, a photosensor may include a pair of electrodes and a photoelectric conversion layer between the pair of electrodes. The photoelectric conversion layer may include a stack of a first n-type semiconductor layer, a second n-type semiconductor layer, and a p-type semiconductor layer between the pair of electrodes.

One of the first n-type semiconductor layer or the second n-type semiconductor layer may include an n-type semiconductor configured to absorb light of a visible light wavelength spectrum, and another one of the first n-type semiconductor layer or the second n-type semiconductor layer may include a transparent n-type semiconductor.

A thickness of the second n-type semiconductor layer may be smaller than a thickness of the first n-type semiconductor layer.

The thickness of the second n-type semiconductor layer may be about 1 nm to about 10 nm.

A sensor-embedded display panel may include a substrate, a light emitting element on the substrate, the light emitting element including a light emitting layer; and the photosensor on the substrate, wherein the photoelectric conversion layer of the photosensor is arranged in parallel with the light emitting layer along an in-plane direction of the substrate such that the photoelectric conversion layer and the light emitting layer at least partially overlap in the in-plane direction. The photoelectric conversion layer may be configured to absorb light of a red wavelength spectrum, a green wavelength spectrum, a blue wavelength spectrum, or any combination thereof.

An electronic device may include the photosensor.

Due to integration with the display panel, the performance of the sensor (e.g., the photosensor) may be improved.

DETAILED DESCRIPTION

Figure 1:
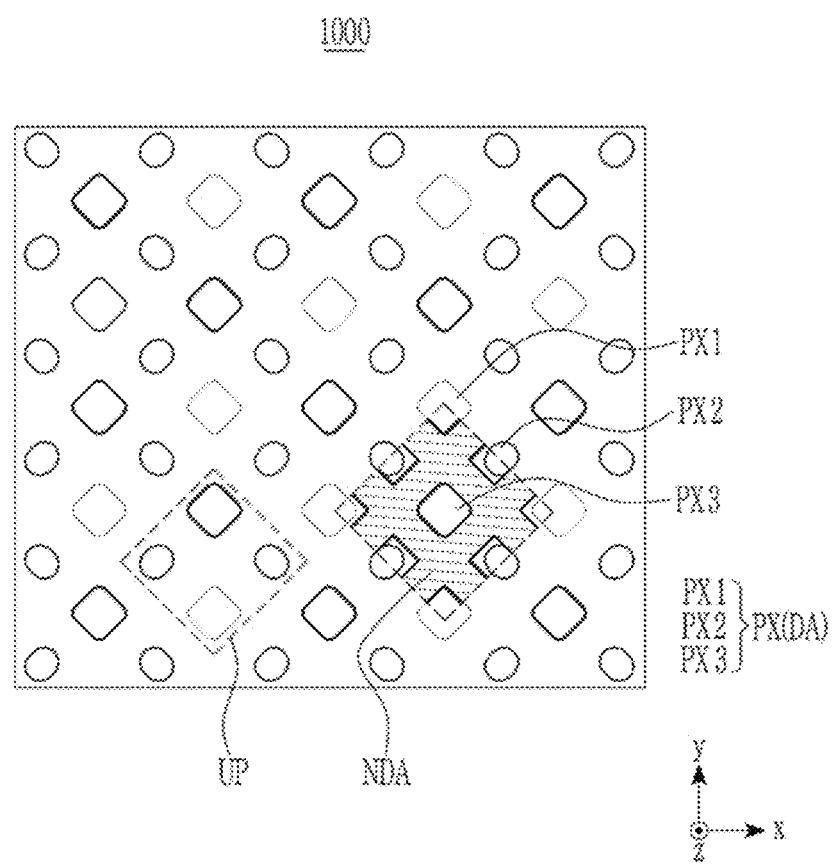
FIG. 1 is a plan view illustrating an example of a sensor-embedded display panel according to some example embodiments.

Hereinafter, some example embodiments will be described in detail so that a person skilled in the art would understand the same. However, a structure that is actually applied may be implemented in various different forms and is not limited to the embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

As used herein, when a definition is not otherwise provided, "hetero" refers to one including 1 to 4 heteroatoms selected from N, O, S, Se, Te, Si, and P.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a sensor-embedded display panel according to some example embodiments is described.

The sensor-embedded display panel according to some example embodiments may be a display panel capable of performing a display function and a recognition function (e.g., biometric recognition function), and may be an in-cell type display panel in which a sensor performing a recognition function (e.g., biometric recognition function) is embedded in the display panel.

Figure 2:
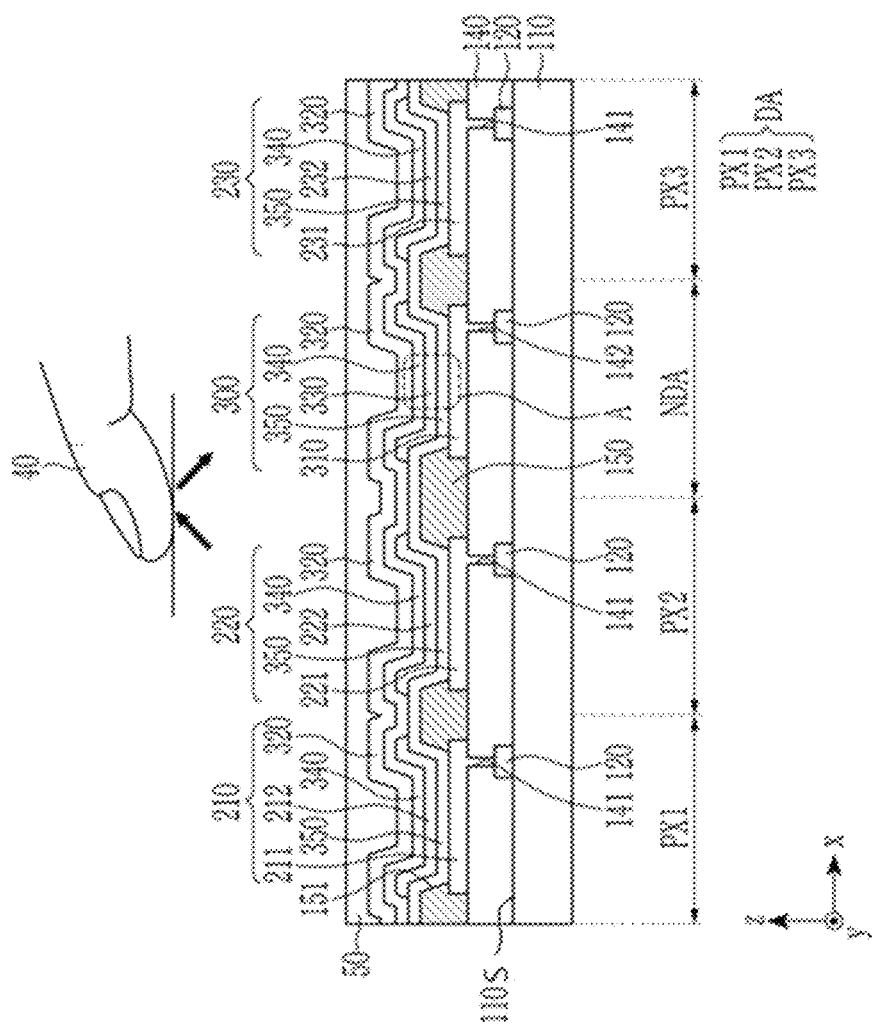
FIG. 2 is a cross-sectional view illustrating an example of a sensor-embedded display panel according to some example embodiments.
Figure 3:
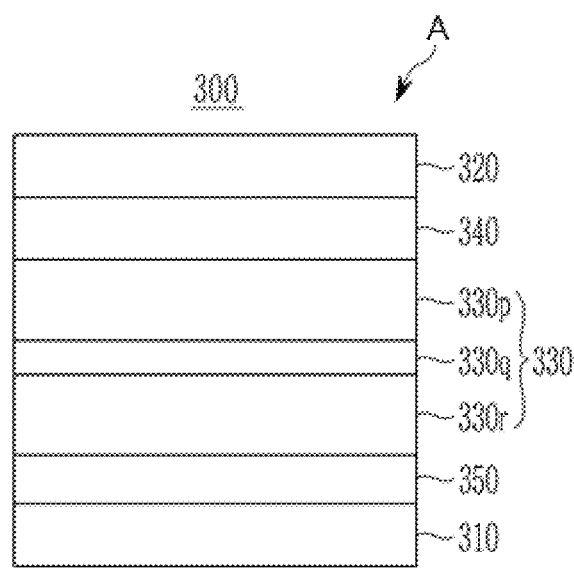
FIG. 3 is a schematic view showing an enlarged portion 'A' of FIG. 2 according to some example embodiments.

FIG. 1 is a plan view illustrating an example of a sensor-embedded display panel according to some example embodiments, FIG. 2 is a cross-sectional view illustrating an example of a sensor-embedded display panel according to some example embodiments, and FIG. 3 is a schematic view showing an enlarged portion 'A' of FIG. 2 according to some example embodiments.

Referring to FIGS. 1 and 2, a sensor-embedded display panel 1000 according to some example embodiments includes a plurality of subpixels PXs displaying (e.g., configured to display) different colors. The plurality of subpixels PXs may be configured to display at least three primary colors, for example, a first subpixel PX1, a second subpixel PX2, and a third subpixel PX3 displaying different first color, second color, and third color selected from red, green, and blue. For example, the first color, the second color, and the third color may be red, green, and blue, respectively. The first subpixel PX1 may be a red subpixel displaying red, the second subpixel PX2 may be a green subpixel displaying green, and the third subpixel PX3 may be a blue subpixel displaying blue. However, the present inventive concepts are not limited thereto, and an auxiliary subpixel (not shown) such as a white subpixel may be further included. Displaying a color may refer to emitting light corresponding to the color (e.g., light in a wavelength spectrum of the color). Referring to FIG. 1, the sensor embedded display panel 1000 may include a plurality of first sub-pixels (PX1) configured to display a red color (e.g., light of a red wavelength spectrum) and including a first light emitting element (e.g., the first light emitting element 210 shown in FIG. 2), a plurality of second sub-pixels (PX2) configured to display a green color (e.g., light of a green wavelength spectrum) and including a second light emitting element (e.g., the second light emitting element 220 shown in FIG. 2), and a plurality of third sub-pixels (PX3) configured to display a blue color (e.g., light of a blue wavelength spectrum) and including a third light emitting element (e.g., the third light emitting element 230 shown in FIG. 2), where the first sub-pixels (PX1), the second sub-pixels (PX2), and the third sub-pixels (PX3) are located in and/or at least partially define the display area (DA).

The plurality of subpixels PXs including the first subpixel PX1, the second subpixel PX2, and the third subpixel PX3 may constitute (e.g., may define) one unit pixel UP to be arranged repeatedly along the row and/or column. In FIG. 1, a structure including one first subpixel PX1, two second subpixels PX2, and one third subpixel PX3 in the unit pixel UP is illustrated, but the present inventive concepts are not limited thereto. At least one first subpixel PX1, at least one second subpixel PX2, and at least one third subpixel PX3 may be included in the unit pixel UP. In the drawing, as an example, an arrangement of a Pentile type is illustrated, but the present inventive concepts are not limited thereto. The subpixels PXs may be arranged variously. An area occupied by the plurality of subpixels PXs and configured to display at least one color by the plurality of subpixels PXs may be a display area DA displaying an image. For example, the area (e.g., in the xy plane) of the sub-pixels (PX) may collectively define the display area (DA) that is configured to display an image thereon (e.g., configured to display one or more colors). A portion of the area (e.g., in the xy plane) of the sensor embedded display panel 1000 that excludes the display area (DA) (e.g., portions of the area of the sensor embedded display panel 100 that are between adjacent subpixels (PX) in the xy direction, xy plane, etc.) may be a non-display area (NDA) that is configured to not display an image thereon (e.g., configured to not display any color).

Each of the first subpixel PX1, the second subpixel PX2, and the third subpixel PX3 may include a light emitting element. As an example, the first subpixel PX1 may include a first light emitting element 210 configured to emit light of a wavelength spectrum of a first color, the second subpixel PX2 may include a second light emitting element 220 configured to emit light of a wavelength spectrum of a second color, and the third subpixel PX3 may include a third light emitting element 230 configured to emit light of a wavelength spectrum of a third color. However, the present inventive concepts are not limited thereto, and at least one of the first subpixel PX1, the second subpixel PX2, or the third subpixel PX3 may include a light emitting element configured to emit light of a combination of a first color, a second color, and a third color, that is, light in a white wavelength spectrum, and may display a first color, a second color, or a third color through a color filter (not shown).

The sensor-embedded display panel 1000 according to some example embodiments includes a photosensor 300. The photosensor 300 may be disposed in a non-display area NDA. The non-display area NDA may be an area other than the display area DA, in which the first subpixel PX1, the second subpixel PX2, the third subpixel PX3, and optionally auxiliary subpixels are not occupied (e.g., a portion of the total area of the sensor embedded display panel 1000 that excludes the display area (DA), excludes the subpixels (PX), is between adjacent subpixels (PX), etc.). The photosensor 300 may be between at least two of the first subpixel PX1 (e.g., a first sub-pixel (PX1) of the plurality of first subpixels (PX1)), the second subpixel PX2 (e.g., a second sub-pixel (PX2) of the plurality of second sub-pixels (PX2)), or the third subpixel PX3 (e.g., a third sub-pixel (PX3) of the plurality of third sub-pixels (PX3)) in the in-plane direction of the substrate 110 (e.g., the xy direction), and may be in parallel with the first, second, and third light emitting elements 210, 220, and 230 in the display area DA for example in parallel along the in-plane direction of the substrate 110 (e.g., the xy direction as shown), which may be a direction extending parallel to an upper surface 110S of the substrate.

The photosensor 300 may be an optical type recognition sensor (e.g., a biometric sensor), and may be configured to absorb light generated by reflection of light emitted from at least one of the first, second or third light emitting elements 210, 220, or 230 in the display area DA, by a recognition target 40 such as a living body, a tool, or an object (e.g., may be configured to absorb light of a red wavelength spectrum, a green wavelength spectrum, a blue wavelength spectrum, or any combination thereof) to convert the absorbed light into an electrical signal. Herein, the living body may be a finger, a fingerprint, a palm, an iris, a face, and/or a wrist, but is not limited thereto. The photosensor 300 may be, for example, a fingerprint sensor, an illumination sensor, an iris sensor, a distance sensor, a blood vessel distribution sensor, and/or a heart rate sensor, but is not limited thereto.

The photosensor 300 may be in parallel with the first, second, and third light emitting elements 210, 220, and 230 on the substrate 110, and may be embedded in the display panel 1000. Restated, the photosensor 300 may be in parallel with the first, second, and third light emitting elements 210, 220, and 230 on the substrate 110 along an in-plane direction of the substrate 110. As described herein, the in-plane direction of the substrate 110 may be a direction (e.g., the xy direction as shown) that extends in parallel with at least a portion of the substrate 110, including an upper surface 110S of the substrate 110.

Referring to FIG. 2, the sensor-embedded display panel 1000 includes a substrate 110; a thin film transistor 120 on the substrate 110; an insulation layer 140 on the thin film transistor 120; a pixel definition layer 150 on the insulation layer 140; and first, second, or third light emitting elements 210, 220, and 230 and the photosensor 300 in a space partitioned by the pixel definition layer 150.

The substrate 110 may be a light-transmitting substrate, for example, a glass substrate or a polymer substrate. The polymer substrate may include, for example, polycarbonate, polymethylmethacrylate, polyethyleneterephthalate, polyethylenenaphthalate, polyimide, polyamide, polyamideimide, polyethersulfone, polyorganosiloxane, styrene-ethylene-butylene-styrene, polyurethane, polyacrylate, polyolefin, or any combination thereof, but is not limited thereto.

A plurality of thin film transistors 120 are formed on the substrate 110. One or more thin film transistor 120 may be included in each subpixel PX, and may include, for example, at least one switching thin film transistor and/or at least one driving thin film transistor. The substrate 110 on which the thin film transistor 120 is formed may be referred to as a thin film transistor substrate (TFT substrate) or a thin film transistor backplane (TFT backplane).

The insulation layer 140 may cover the substrate 110 and the thin film transistor 120 and may be formed on the whole surface of the substrate 110. The insulation layer 140 may be a planarization layer or a passivation layer, and may include an organic insulating material, an inorganic insulating material, an organic-inorganic insulating material, or any combination thereof. The insulation layer 140 may have a plurality of contact holes 141 for connecting the first, second, and third light emitting elements 210, 220, and 230 and the thin film transistor 120 and a plurality of contact holes 142 for electrically connecting the photosensor 300 and the thin film transistor 120. The insulation layer 140 may include an organic, inorganic, or organic-inorganic insulating material, in some example embodiments, an inorganic insulating material such as silicon oxide, silicon nitride, silicon oxynitride, aluminum oxide, aluminum nitride, or aluminum oxyniyride; an organic insulating material such as polyimide, polyamide, polyamideimide, or polyacrylate; or an organic-inorganic insulating material such as polyorganosiloxane or polyorganosilazane.

The pixel definition layer 150 may also be formed on the whole surface (e.g., entire upper surface 110S) of the substrate 110 and may be between adjacent subpixels PXs (e.g., in the xy direction as shown in FIG. 2) to partition each subpixel PX. The pixel definition layer 150 may have and/or define a plurality of openings 151 disposed in each subpixel PX, and in each opening 151, any one of first, second, or third light emitting elements 210, 220, or 230 or the photosensors 300 may be disposed. The pixel definition layer 150 be an insulation layer that may include an organic, inorganic, or organic-inorganic insulating material, in some example embodiments, an inorganic insulating material such as silicon oxide, silicon nitride, silicon oxynitride, aluminum oxide, aluminum nitride, or aluminum oxyniyride; an organic insulating material such as polyimide, polyamide, polyamideimide, or polyacrylate; or an organic-inorganic insulating material such as polyorganosiloxane or polyorganosilazane.

The first, second and third light emitting elements 210, 220, and 230 are formed on the substrate 110 (or thin film transistor substrate), and are repeatedly arranged along the in-plane direction (e.g., xy direction) of the substrate 110. As described above, the first, second, and third light emitting elements 210, 220, and 230 may be included in the first subpixel PX1, the second subpixel PX2, and the third subpixel PX3, respectively. The first, second, and third light emitting elements 210, 220, and 230 may be electrically connected to separate thin film transistors 120 and may be driven independently.

The first, second, and third light emitting elements 210, 220, and 230 may be configured to each independently emit one light of a red wavelength spectrum, a green wavelength spectrum, a blue wavelength spectrum, or any combination thereof. For example, the first light emitting element 210 may be configured to emit light of a red wavelength spectrum, the second light emitting element 220 may be configured to emit light of a green wavelength spectrum, and the third light emitting element 230 may be configured to emit light of a blue wavelength spectrum. Herein, the red wavelength spectrum, the green wavelength spectrum, and the blue wavelength spectrum may have a maximum emission wavelength (λmax) of greater than or equal to about 600 nm and less than about 750 nm, about 500 nm to about 600 nm, and greater than or equal to about 400 nm and less than about 500 nm, respectively.

The first, second, and third light emitting elements 210, 220, and 230 may be, for example, light emitting diodes, for example organic light emitting diodes (OLEDs) including an organic material.

The photosensor 300 may be formed on the substrate 110 (or the TFT substrate), and may be randomly or regularly arranged along the in-plane direction (e.g., xy direction) of the substrate 110. As described above, the photosensor 300 may be disposed in the non-display area NDA, and may be connected to a separate thin film transistor 120 to be independently driven. The photosensor 300 may be configured to absorb light of the same wavelength spectrum as the light emitted from at least one of the first, second, or third light emitting elements 210, 220, or 230 and then convert the absorbed light into an electrical signal. For example, the photosensor 300 may be configured to absorb light of a red wavelength spectrum, a green wavelength spectrum, a blue wavelength spectrum, or any combination thereof, and then convert the absorbed light into an electrical signal. The photosensor 300 may be, for example, a photoelectric conversion diode, for example an organic photoelectric conversion diode including an organic material.

Each of the first, second, and third light emitting elements 210, 220, and 230 and the photosensor 300 may include a separate pixel electrode 211, 221, 231, and 310; a separate portion of a common electrode 320 facing the pixel electrodes 211, 221, 231, and 310 and to which a common voltage is applied; and a separate light emitting layers 212, 222, or 232 or a photoelectric conversion layer 330, a separate portion of a first common auxiliary layer 340, and a separate portion of a second common auxiliary layer 350 between the pixel electrode 211, 221, 231, and 310 and the common electrode 320.

The first, second, and third light emitting elements 210, 220, and 230 and the photosensor 300 may be arranged in parallel along the in-plane direction (e.g., xy direction) of the substrate 110, and may share the common electrode 320, the first common auxiliary layer 340, and the second common auxiliary layer 350 which are formed on the whole surface.

The common electrode 320 is continuously formed as a single piece of material that extends on the light emitting layers 212, 222, and 232 and the photoelectric conversion layer 330, and is substantially formed on the whole surface of the substrate 110. The common electrode 320 may apply a common voltage to the first, second, and third light emitting elements 210, 220, and 230 and the photosensor 300. As shown, the first, second, and third light emitting elements 210, 220, and 230 and the photosensor 300 may include separate portions of a single common electrode 320 that is a single piece of material that extends on each of the respective light emitting layers 212, 222, and 232 and the photoelectric conversion layer 330 and between the first, second, and third light emitting elements 210, 220, and 230 and the photosensor 300.

The first common auxiliary layer 340 may be between the light emitting layers 212, 222, and 232 and the photoelectric conversion layer 330, and the common electrode 320, and may continuously be formed as a single piece of material that extends on upper portions of the light emitting layers 212, 222, and 232 and the photoelectric conversion layer 330 and under the common electrode 320. As shown, the first, second, and third light emitting elements 210, 220, and 230 and the photosensor 300 may include separate portions of a single first common auxiliary layer 340 that is a single piece of material that extends on each of the respective light emitting layers 212, 222, and 232 and the photoelectric conversion layer 330 and between the first, second, and third light emitting elements 210, 220, and 230 and the photosensor 300.

The first common auxiliary layer 340 may be a charge auxiliary layer (e.g., electron auxiliary layer) that facilitates injection and/or movement of charge carriers (e.g., electrons) from the common electrode 320 to the light emitting layers 212, 222, and 232. For example, the LUMO energy level of the first common auxiliary layer 340 may be between the LUMO energy level of the light emitting layers 212, 222, and 232 and the work function of the common electrode 320. The work function of the common electrode 320, the LUMO energy level of the first common auxiliary layer 340, and the LUMO energy level of the light emitting layers 212, 222, and 232 may become sequentially shallow (e.g., sequentially smaller in relation to a vacuum level (e.g., 0 eV). On the other hand, the LUMO energy level of the first common auxiliary layer 340 may be shallower than the LUMO energy level of the photoelectric conversion layer 330 and the work function of the common electrode 320, respectively.

The first common auxiliary layer 340 may include an organic material, an inorganic material, an organic-inorganic material, or any combination thereof satisfying the LUMO energy level, for example a halogenated metal such as LiF, NaCl, CsF, RbCl, and RbI; a lanthanides metal such as Yb; a metal oxide such as $Li_2O$ or BaO; Liq (lithium quinolate), Alq3 (tris(8-hydroxyquinolinato)aluminum), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), $Bebq_2$ (berylliumbis(benzoquinolin-10-olate), ADN (9,10-di(naphthalene-2-yl) anthracene), BmPyPhB (1,3-bis[3,5-di(pyridin-3-yl)phenyl] benzene), or any combination thereof, but is not limited thereto. The first common auxiliary layer 340 may be one layer or two or more layers.

The second common auxiliary layer 350 may be between the light emitting layers 212, 222, and 232 and the photoelectric conversion layer 330, and the substrate 110, and among them, the light emitting layers 212, 222, 232 and the photoelectric conversion layer 330, and the pixel electrodes 211, 221, 231, and 310. The second common auxiliary layer 350 may continuously be formed as a single piece of material that extends under the light emitting layers 212, 222, and 232 and the photoelectric conversion layer 330 and on the pixel electrodes 211, 221, 231, and 310. As shown, the first, second, and third light emitting elements 210, 220, and 230 and the photosensor 300 may include separate portions of a single second common auxiliary layer 350 that is a single piece of material that extends under each of the respective light emitting layers 212, 222, and 232 and the photoelectric conversion layer 330 and between the first, second, and third light emitting elements 210, 220, and 230 and the photosensor 300.

The second common auxiliary layer 350 may be a charge auxiliary layer (e.g., hole auxiliary layer) that facilitates injection and/or movement of charge carriers (e.g., holes) from the pixel electrodes 211, 221, and 231 to the light emitting layers 212, 222, and 232. For example, the HOMO energy level of the second common auxiliary layer 350 may be between the HOMO energy level of the light emitting layers 212, 222, and 232 and the work function of the pixel electrodes 211, 221, and 231. The work function of the pixel electrodes 211, 221, and 231, the HOMO energy level of the second common auxiliary layer 350, and the HOMO energy level of the light emitting layers 212, 222, and 232 may become sequentially deep (e.g., sequentially larger in relation to 0 eV of a vacuum level).

The second common auxiliary layer 350 may include an organic material, an inorganic material, an organic-inorganic material, or any combination thereof satisfying the HOMO energy level, for example a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino]triphenylamine), TDATA (4,4'4"-tris(N,N-diphenylamino)triphenylamine), 2-TNATA (4,4',4"-tris{N-(2-naphthyl)-N-phenylamino}-triphenylamine), PEDOT/PSS (poly(3,4-ethylenedioxythiophene)/poly(4-styrenesulfonate)), PAN I/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h]quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-1-yl)-N,N'-diphenyl-benzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The second common auxiliary layer 350 may be one layer or two or more layers.

Each of the first, second and third light emitting elements 210, 220, and 230 and the photosensor 300 includes a separate pixel electrode 211, 221, 231, or 310 facing the common electrode 320. One of the pixel electrodes 211, 221, 231, and 310 or the common electrode 320 is an anode and the other is a cathode. For example, the pixel electrodes 211, 221, 231, and 310 may be an anode, and the common electrode 320 may be a cathode. The pixel electrodes 211, 221, 231, and 310 are separated for each subpixel PX, and are electrically connected to each separate thin film transistor 120 to be independently driven.

Each of the pixel electrodes 211, 221, 231, and 310 and the common electrode 320 may be a light-transmitting electrode or a reflective electrode. For example, at least one of the pixel electrodes 211, 221, 231, and 310 or the common electrode 320 may be a light-transmitting electrode.

The transparent electrode may have a light transmittance of greater than or equal to about 85%, greater than or equal to about 90%, or greater than or equal to about 95% and the semi-transmissive electrode may have a light transmittance of greater than or equal to about 30% and less than about 85%, about 40% to about 80%, or about 40% to about 75%. The transparent electrode and the semi-transmissive electrode may include, for example, at least one of an oxide conductor, a carbon conductor, or a metal thin film. The oxide conductors may include, for example, one or more of indium tin oxide (ITO), indium zinc oxide (IZO), zinc tin oxide (ZTO), aluminum tin oxide (ATO), and aluminum zinc oxide (AZO), the carbon conductor may include one or more selected from graphene and carbon nanostructures, and the metal thin film may be a very thin film including aluminum (Al), magnesium (Mg), silver (Ag), gold (Au), magnesium-silver (Mg—Ag), magnesium-aluminum (Mg—Al), an alloy thereof, or any combination thereof.

The reflective electrode may include a reflective layer having a light transmittance of less than or equal to about 5% and/or a reflectance of greater than or equal to about 80%, and the reflective layer may include an optically opaque material. The optically opaque material may include a metal, a metal nitride, or any combination thereof, for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

For example, when the pixel electrodes 211, 221, 231, and 310 are light-transmitting electrodes and the common electrode 320 is a reflective electrode, the sensor-embedded display panel 1000 may be a bottom emission type display panel configured to emit light toward the substrate 110. For example, when the pixel electrodes 211, 221, 231, and 310 are reflective electrodes and the common electrode 320 is a light-transmitting electrode, the sensor-embedded display panel 1000 may be a top emission type display panel configured to emit light toward the opposite side of the substrate 110. For example, when the pixel electrodes 211, 221, 231, and 310 and the common electrode 320 are light-transmitting electrodes, respectively, the sensor-embedded display panel 1000 may be a both side emission type display panel configured to emit light toward both the substrate 110 and the opposite side of the substrate 110.

For example, the pixel electrodes 211, 221, 231, and 310 may be reflective electrodes and the common electrode 320 may be a semi-transmissive electrode. In this case, the sensor-embedded display panel 1000 may have a microcavity structure. In the microcavity structure, reflection may occur repeatedly between the reflective electrode and the semi-transmissive electrode separated by a particular (or, alternatively, predetermined) optical length (e.g., a distance between the semi-transmissive electrode and the reflective electrode) and light of a particular (or, alternatively, predetermined) wavelength spectrum may be enhanced to improve optical properties.

For example, among the light emitted from the light emitting layers 212, 222, and 232 of the first, second, and third light emitting elements 210, 220, and 230, light of a particular (or, alternatively, predetermined) wavelength spectrum may be repeatedly reflected between the semi-transmissive electrode and the reflective electrode and then may be modified. Among the modified light, light of a wavelength spectrum corresponding to a resonance wavelength of a microcavity may be enhanced to exhibit amplified light emission characteristics in a narrow wavelength spectrum. Accordingly, the sensor-embedded display panel 1000 may express colors with high color purity.

For example, among the light incident on the photosensor 300, light of a particular (or, alternatively, predetermined) wavelength spectrum may be repeatedly reflected between the semi-transmissive electrode and the reflective electrode to be modified. Among the modified light, light having a wavelength spectrum corresponding to the resonance wavelength of a microcavity may be enhanced to exhibit photoelectric conversion characteristics amplified in a narrow wavelength region. Accordingly, the photosensor 300 may exhibit high photoelectric conversion characteristics in a narrow wavelength spectrum.

Each of the first, second, and third light emitting elements 210, 220, and 230 includes light emitting layers 212, 222, and 232 between the pixel electrodes 211, 221, and 231 and the common electrode 320. Each of the light emitting layer 212 included in the first light emitting element 210, the light emitting layer 222 included in the second light emitting element 220, and the light emitting layer 232 included in the third light emitting element 230 may be configured to emit light in the same or different wavelength spectra and may be configured to emit light in, for example a red wavelength spectrum, a green wavelength spectrum, a blue wavelength spectrum, or any combination thereof.

For example, when the first light emitting element 210, the second light emitting element 220, and the third light emitting element 230 are a red light emitting elements, a green light emitting element, and a blue light emitting element, respectively, the light emitting layer 212 may be a red light emitting layer configured to emit light in a red wavelength spectrum, the light emitting layer 222 included in the second light emitting element 220 may be a green light emitting layer configured to emit light in a green wavelength spectrum, and the light emitting layer 232 included in the third light emitting element 230 may be a blue light emitting layer configured to emit light in a blue wavelength spectrum. Herein, the red wavelength spectrum, the green wavelength spectrum, and the blue wavelength spectrum may have a maximum emission wavelength of greater than or equal to about 600 nm and less than about 750 nm, about 500 nm to about 600 nm, and greater than or equal to about 400 nm and less than about 500 nm, respectively.

For example, when at least one of the first light emitting element 210, the second light emitting element 220, or the third light emitting element 230 is a white light emitting element, the light emitting layer of the white light emitting element may be configured to emit light of a full visible light wavelength spectrum, for example, light in a wavelength spectrum of greater than or equal to about 380 nm and less than about 750 nm, about 400 nm to about 700 nm, or about 420 nm to about 700 nm.

The light emitting layers 212, 222, and 232 may include an organic light emitting material, a quantum dot, a perovskite, or any combination thereof as a light emitter. For example, the light emitting layers 212, 222, and 232 may include an organic light emitting material, and may include at least one host material or a fluorescent or phosphorescent dopant.

The organic light emitting material may be, for example, perylene; rubrene; 4-(dicyanomethylene)-2-methyl-6-[p-(dimethylamino)styryl]-4H-pyran, coumarin or a derivative thereof; carbazole or a derivative thereof; TPBi (2,2',2"-(1, 3,5-benzinetriyl)-tris(1-phenyl-1-H-benzimidazole), TBADN (2-t-butyl-9,10-di(napth-2-yl)anthracene), AND (9,10-di(naphthalene-2-yl)anthracene), CBP (4,4'-bis(N-carbazolyl)-1,1'-biphenyl); TCTA (4,4',4"-tris(carbazol-9-yl)-triphenylamine); TPBi (1,3,5-tris(N-phenylbenzimidazole-2-yl)benzene), TBADN (3-tert-butyl-9,10-di(naphth-2-yl) anthracene), DSA (distyrylarylene); CDBP (4,4"-dimethyl-biphenyl); MADN (2-Methyl-9,10-bis(naphthalen-2-yl) anthracene), TCP (1,3,5-tris(carbazol-9-yl)benzene), Alq3 (tris(8-hydroxyquinolino)lithium); an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag and/or Au, a derivative thereof, or any combination thereof, but is not limited thereto.

The quantum dot may include, for example, a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or any combination thereof. The Group II-IV semiconductor compound may be, for example, selected from a binary element semiconductor compound selected from CdSe, CdTe, ZnS, ZnSe, ZnTe, ZnO, HgS, HgSe, HgTe, MgSe, MgS, or any combination thereof; a ternary element semiconductor compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or any combination thereof; and a quaternary element semiconductor compound selected from HgZnTeS, CdZnSeS, CdZnSeTe, CdZnSTe, CdHgSeS, CdHgSeTe, CdHgSTe, HgZnSeS, HgZnSeTe, HgZnSTe, or any combination thereof, but is not limited thereto. The Group III-V semiconductor compound may be, for example, selected from a binary element semiconductor compound selected from GaN, GaP, GaAs, GaSb, AlN, AlP, AlAs, AlSb, InN, InP, InAs, InSb, or any combination thereof; a ternary element semiconductor compound selected from GaNP, GaNAs, GaNSb, GaPAs, GaPSb, AlNP, AlNAs, AlNSb, AlPAs, AlPSb, InNP, InNAs, InNSb, InPAs, InPSb, or any combination thereof; and a quaternary element semiconductor compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, but is not limited thereto. The Group IV-VI semiconductor compound may be, for example, selected from a binary element semiconductor compound selected from SnS, SnSe, SnTe, PbS, PbSe, PbTe, or any combination thereof; a ternary element semiconductor compound selected from SnSeS, SnSeTe, SnSTe, PbSeS, PbSeTe, PbSTe, SnPbS, SnPbSe, SnPbTe, or any combination thereof; and a quaternary element semiconductor compound selected from SnPbSSe, SnPbSeTe, SnPbSTe, or any combination thereof, but is not limited thereto. The Group IV semiconductor compound may be, for example, selected from a single-element semiconductor compound such as Si, Ge, or any combination thereof; and a binary element compound selected from SiC, SiGe, or any combination thereof, but is not limited thereto. The Group semiconductor compound may be, for example, $CuInSe_2$, $CuInS_2$, CuInGaSe, CuInGaS, or any combination thereof, but is not limited thereto. The Group I-II-IV-VI semiconductor compound may be, for example, CuZnSnSe, CuZnSnS, or any combination thereof, but is not limited thereto. The Group II-III-V semiconductor compound may be, for example, InZnP, but is not limited thereto.

The perovskite may be $CH_3NH_3PbBr_3$, $CH_3NH_3PbI_3$, $CH_3NH_3SnBr_3$, $CH_3NH_3SnI_3$, $CH_3NH_3Sn_{1-x}Pb_xBr_3$, $CH_3NH_3Sn_{1-x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, ($C_6H_5CH_2NH_3)_2PbI_4$, $(C_6H_5C_2H_4NH_3)_2PbBr_4$, $(C_6H_{13}NH_3)_2(CH_3NH_3)_{n1}Pb_nI_{3n+1}$, any combination thereof, but is not limited thereto.

The photosensor 300 includes a photoelectric conversion layer 330 between the pixel electrode 310 and the common electrode 320. The photoelectric conversion layer 330 is in parallel with the light emitting layers 212, 222, and 232 of the first, second, and third light emitting elements 210, 220, and 230 along the in-plane direction (e.g., xy direction) of the substrate 110. The photoelectric conversion layer 330 and the light emitting layers 212, 222, and 232 may be on the same plane. For example, as shown in at least FIG. 2, the photoelectric conversion layer 330 of the photosensor 300 and the light emitting layers 212, 222, and 232 of the first, second, and third light emitting elements 210, 220, and 230 may at least partially overlap with each other (e.g., partially or completely overlap each other) in the in-plane direction (e.g., xy direction) of the substrate 110, which may be understood to be a horizontal direction that extends in parallel to an in-plane direction of the substrate 110 as shown in FIG. 2 and/or a horizontal direction that extends in parallel to an upper surface 110S of the substrate 110 as shown in FIG. 2, and the photoelectric conversion layer 330 and the light emitting layers 212, 222, and 232 may be at least partially positioned on the same plane (e.g., an xy plane extending in the xy directions that intersects each of the photoelectric conversion layer 330 and the light emitting layers 212, 222, and 232).

The photoelectric conversion layer 330 may be configured to absorb light of a particular (or, alternatively, predetermined) wavelength spectrum and convert the absorbed light into an electrical signal, and may be configured to absorb light generated by reflection of the aforementioned light emitted from at least one of the first, second, or third light emitting elements 210, 220, and 230 and reflected by the recognition target 40 and convert it into an electrical signal. The photoelectric conversion layer 330 may be configured to absorb light of a red wavelength spectrum, a green wavelength spectrum, a blue wavelength spectrum, an infrared wavelength spectrum, or any combination thereof.

For example, the photoelectric conversion layer 330 may be configured to selectively absorb light in a red wavelength spectrum having a maximum absorption wavelength in greater than about 600 nm and less than about 750 nm, and may be configured to absorb light emitted from the red light emitting element among the first, second, and third light emitting elements 210, 220, and 230 and then reflected by the recognition target 40.

For example, the photoelectric conversion layer 330 may be configured to selectively absorb light in a green wavelength spectrum having a maximum absorption wavelength in about 500 nm to about 600 nm, and may be configured to absorb light emitted from the green light emitting element among the first, second and third light emitting elements 210, 220, and 230 and then reflected by the recognition target 40.

For example, the photoelectric conversion layer 330 may be configured to selectively absorb light in a blue wavelength spectrum having a maximum absorption wavelength in greater than or equal to about 380 nm and less than about 500 nm, and may be configured to absorb light emitted from the blue light emitting element among the first, second, and third light emitting elements 210, 220, and 230 and then reflected, by the recognition target 40.

For example, the photoelectric conversion layer 330 may be configured to absorb light in a red wavelength spectrum, a green wavelength spectrum, and a blue wavelength spectrum, that is, light of a full visible light wavelength spectrum of greater than or equal to about 380 nm and less than about 750 nm. The photoelectric conversion layer 330 may be configured to absorb light emitted from the light emitting elements 210, 220, and 230 and then reflected by the recognition target 40.

Referring to FIG. 3, the photoelectric conversion layer 330 may have a stacked structure including a plurality of layers, for example, a first n-type semiconductor layer 330p, a second n-type semiconductor layer 330q, and a p-type semiconductor layer 330r. As shown, the photoelectric conversion layer 330 may include a sequential stack, from the first common auxiliary layer 340, of the first n-type semiconductor layer 330p, the second n-type semiconductor layer 330q, and the p-type semiconductor layer 330r. For example, in some example embodiments, the photoelectric conversion layer 330 may be referred to as a stack, for example a sequential stack, of a stack of first n-type semiconductor layer 330p, the second n-type semiconductor layer 330q, and the p-type semiconductor layer 330r, wherein the stack is between the common electrode 320 and a pixel electrode 310 of the photosensor 300. The first n-type semiconductor layer 330p and the second n-type semiconductor layer 330q may include different n-type semiconductors in relation to each other, while the p-type semiconductor layer 330r may include a p-type semiconductor.

The first n-type semiconductor layer 330p is close to the first common auxiliary layer 340, the p-type semiconductor layer 330r is close to the second common auxiliary layer 350, and the second n-type semiconductor layer 330q is between the first n-type semiconductor layer 330p and the p-type semiconductor layer 330r.

At least one of the first n-type semiconductor layer 330p or the second n-type semiconductor layer 330q may form a pn junction with the p-type semiconductor layer 330r, and thus may be configured to receive light from the outside and generate excitons and then, separate the excitons into holes and electrons.

The p-type semiconductor included in the p-type semiconductor layer 330r may determine (e.g., may at least partially define) light absorption characteristics of the photoelectric conversion layer 330. For example, the p-type semiconductor included in the p-type semiconductor layer 330r may have wavelength selectivity selectively absorbing any one of a red wavelength spectrum, a green wavelength spectrum, a blue wavelength spectrum, or an infrared wavelength spectrum. In other words, an absorption spectrum of the p-type semiconductor layer 330r may be a main absorption spectrum of the photoelectric conversion layer 330.

The p-type semiconductor included in the p-type semiconductor layer 330r may be an organic material, an inorganic material, or an organic-inorganic material that satisfies a particular (or, alternatively, predetermined) HOMO energy level, for example, a HOMO energy level of about 5.0 eV to about 6.0 eV, about 5.1 eV to about 5.9 eV, about 5.2 eV to about 5.8 eV, or about 5.3 eV to about 5.8 eV.

The p-type semiconductor may be, for example, a low-molecular organic compound capable of being deposited, for example, an organic compound including an electron donating moiety and an electron accepting moiety. For example, the p-type semiconductor may be represented by Chemical Formula A.

$$EDM\text{-}LM\text{-}EAM \qquad \text{[Chemical Formula A]}$$

In Chemical Formula A,

EDM may be an electron-donating moiety,

EAM may be an electron accepting moiety, and

LM may be a pi conjugated linking moiety that links the electron donating moiety and the electron accepting moiety.

For example, a p-type semiconductor configured to selectively absorb light in a green wavelength spectrum (hereinafter referred to as a "green p-type semiconductor") may be, for example, an organic compound represented by Chemical Formula A-1.

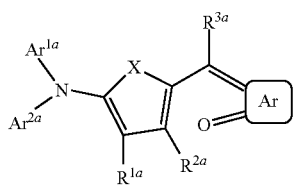

[Chemical Formula A-1]

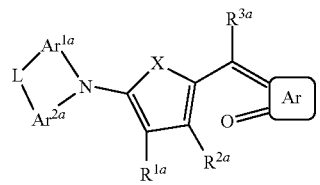

[Chemical Formula A-1-1]

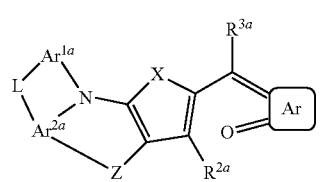

[Chemical Formula A-1-2]

In Chemical Formula A-1,

X may be O, S, Se, Te, SO, $SO_2$, $CR^bR^c$, or $SiR^dR^e$,

Ar may be a substituted or unsubstituted $C_6$ to $C_{30}$ arylene group, a substituted or unsubstituted $C_3$ to $C_{30}$ heterocyclic group, or fused rings thereof, $Ar^{1a}$ and $Ar^{2a}$ may each independently be a substituted or unsubstituted $C_6$ to $C_{30}$ aryl(ene) group or a substituted or unsubstituted $C_3$ to $C_{30}$ heteroaryl(ene) group, $R^{1a}$ to $R^{3a}$ and $R^b$ to $R^e$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and $Ar^{1a}$, $Ar^{2a}$, $R^{1a}$, and $R^{2a}$ may each independently be present, or two adjacent ones of $Ar^{1a}$, $Ar^{2a}$, $R^{1a}$, or $R^{2a}$ may be linked to each other to form a ring.

For example, $Ar^{1a}$ and $Ar^2$a may each independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ may be fused to each other to form a ring.

For example, $Ar^{2a}$ and $R^{1a}$ may be fused to each other to form a ring.

Specifically, p-type semiconductor may be represented by Chemical Formula A-1-1 or A-1-2.

In Chemical Formulas A-1-1 and A-1-2,

X may be O, S, Se, Te, SO, $SO_2$, $CR^bR^c$, or $SiR^dR^e$,

Ar may be a substituted or unsubstituted C6 to C30 arylene group, a substituted or unsubstituted C3 to C30 heterocyclic group, or fused rings thereof, $Ar^{1a}$ and $Ar^{2a}$ may each independently be a substituted or unsubstituted C6 to C30 arylene group or a substituted or unsubstituted C3 to C30 heteroarylene group, L and Z may each independently be a single bond, O, S, Se, Te, SO, $SO_2$, $CR^fR^g$, $SiR^hR^i$, $GeR^jR^k$, $NR^l$, a substituted or unsubstituted C1 to C30 alkylene group, a substituted or unsubstituted C3 to C30 cycloalkylene group, a substituted or unsubstituted C6 to C30 arylene group, or any combination thereof, and $R^{1a}$, $R^{2a}$, $R^{3a}$, and $R^b$ to $R^l$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, halogen, a cyano group, or any combination thereof.

For example, the green p-type semiconductor may be selected from compounds listed in Group 2A, 2B, 2C, or 2D, but is not limited thereto.

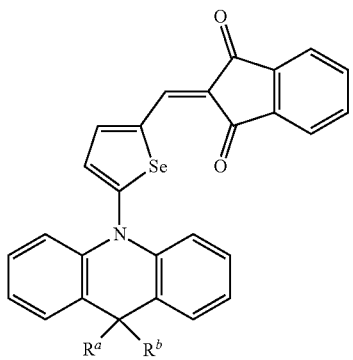

[Group 2A]

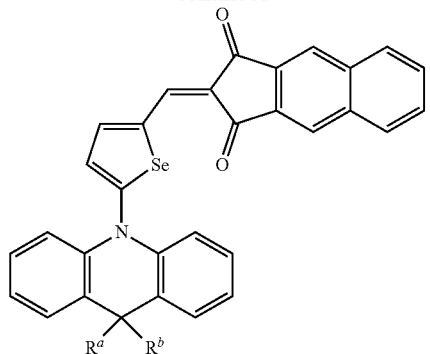
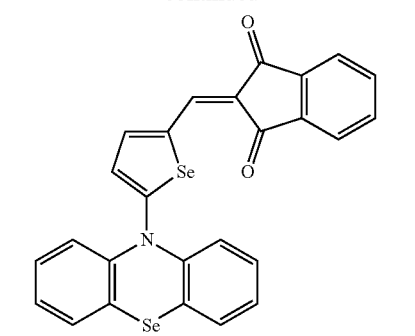
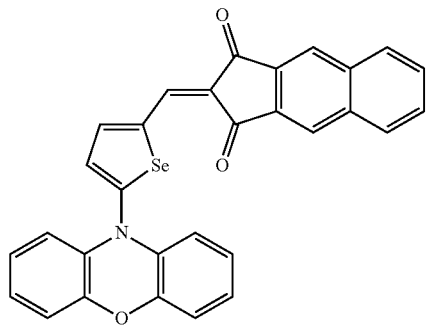
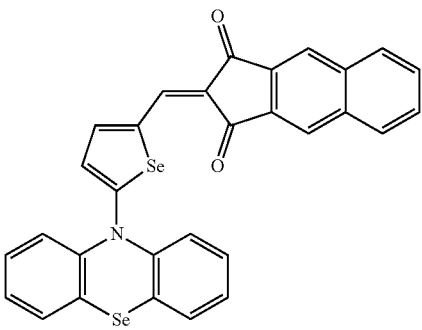
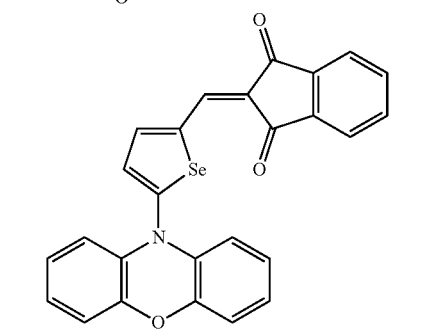
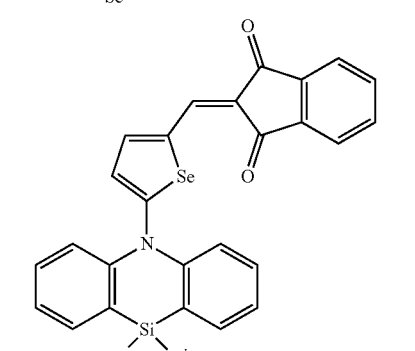
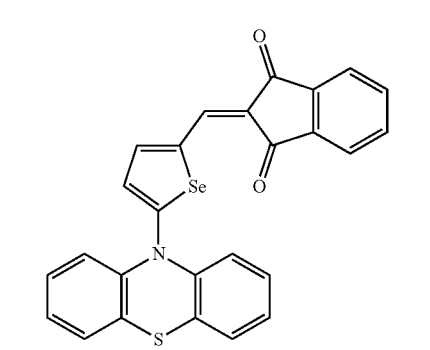
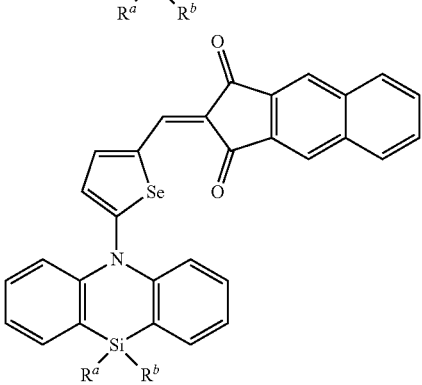
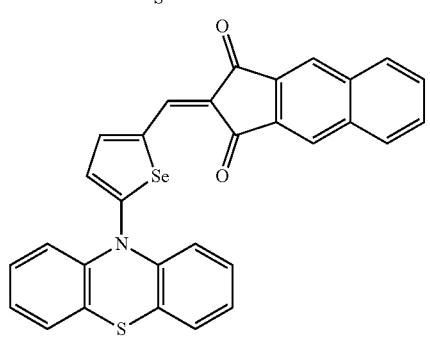

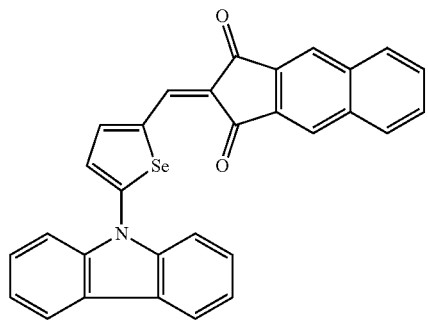
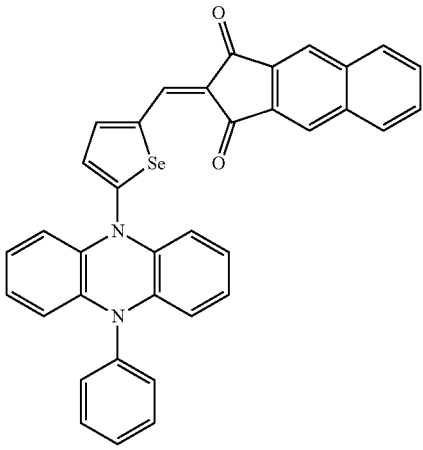
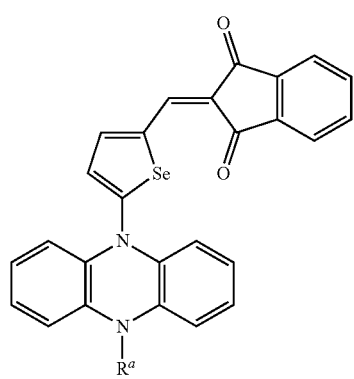
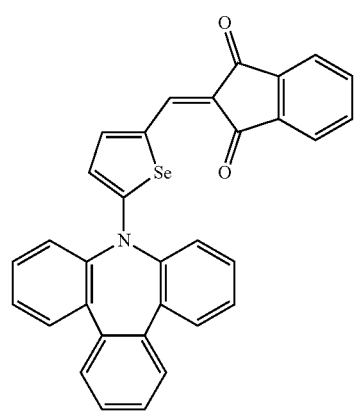
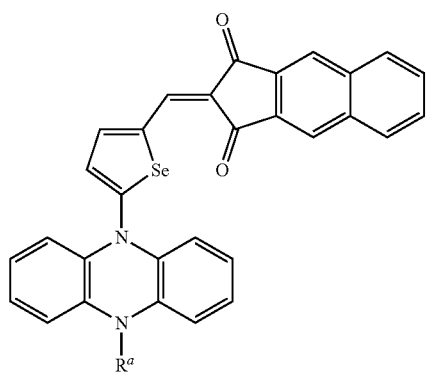
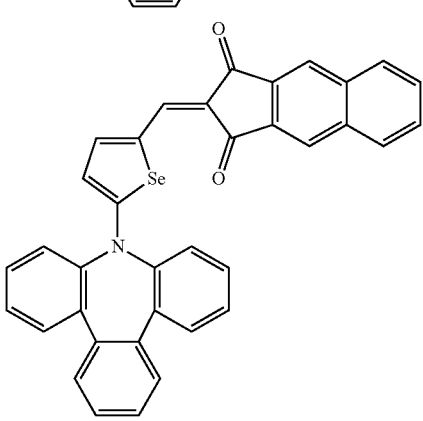
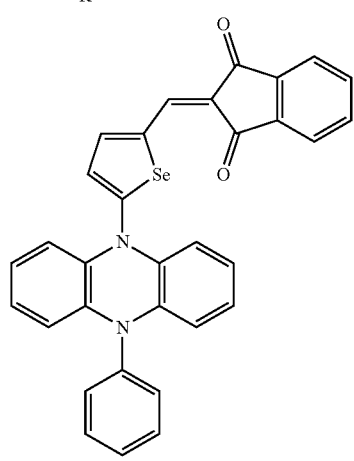
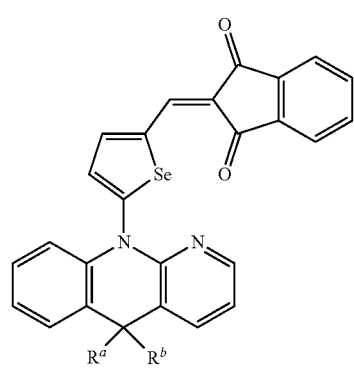

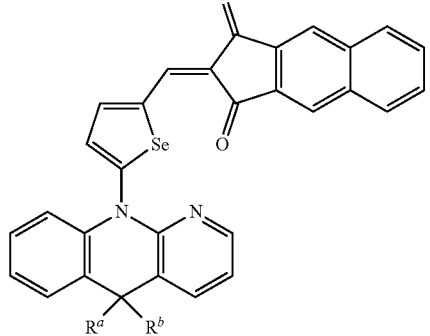
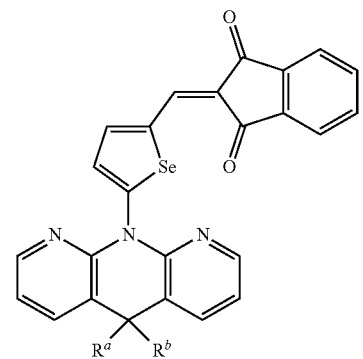
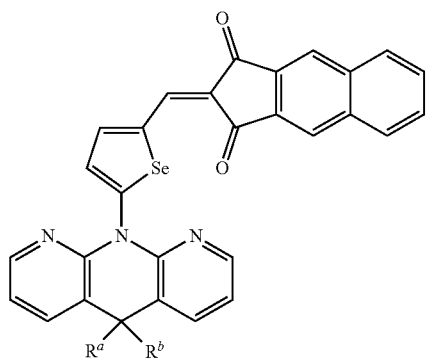
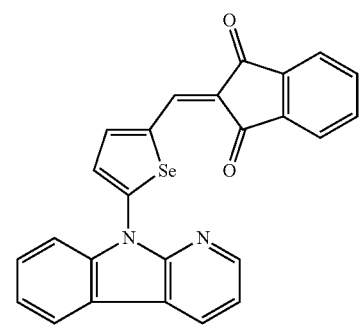
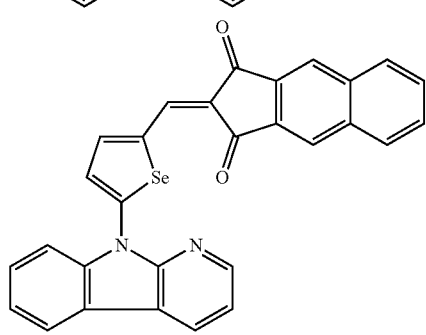
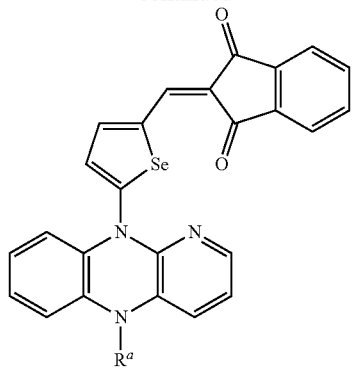
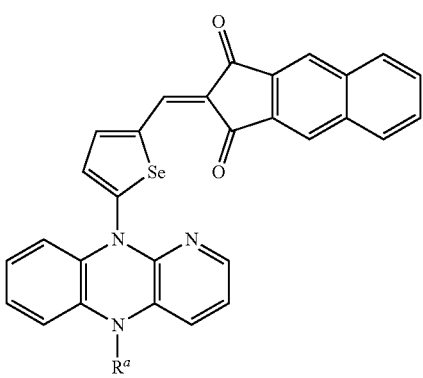
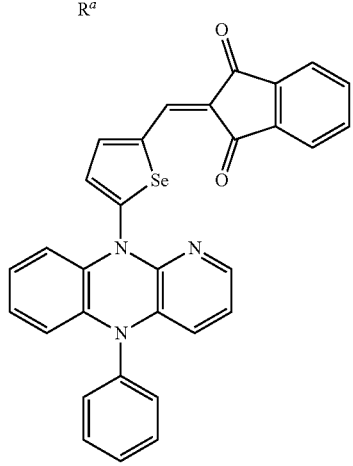
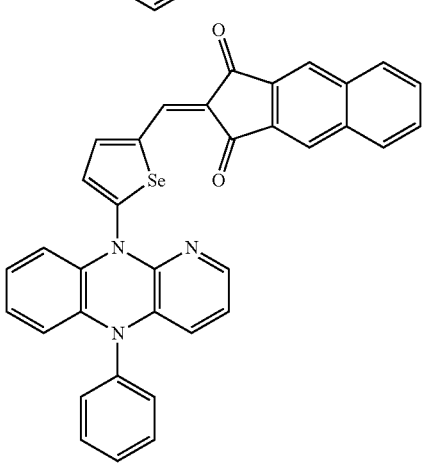

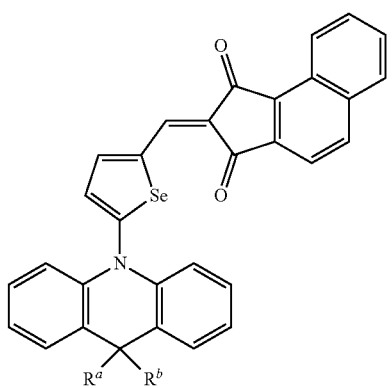
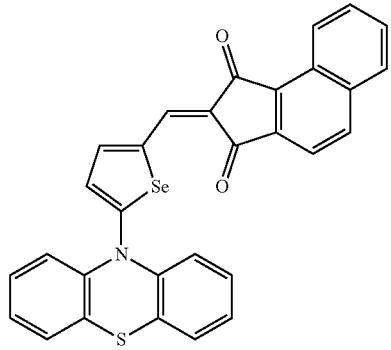
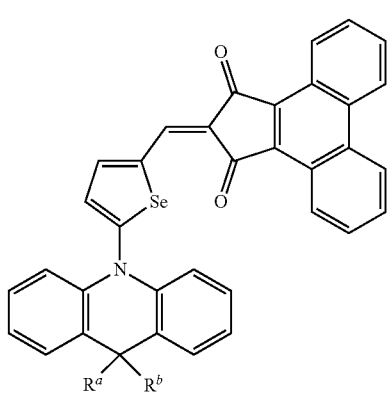
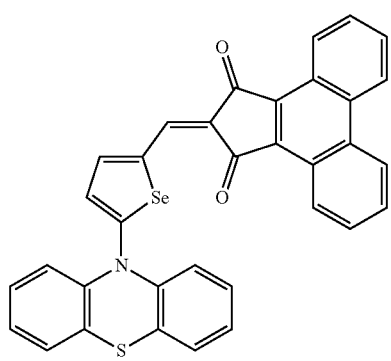
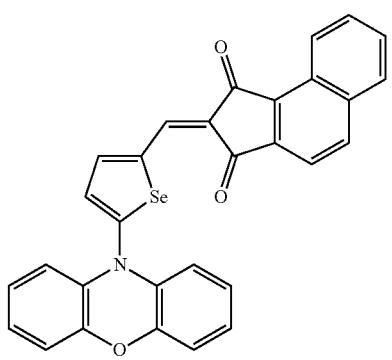
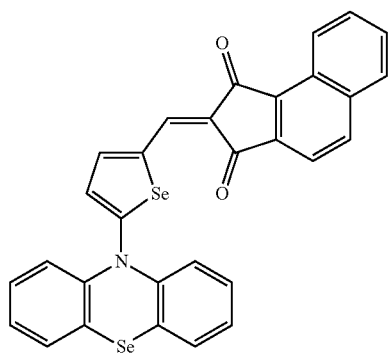
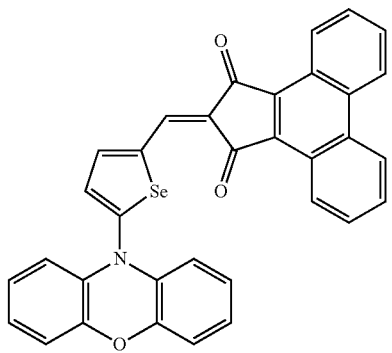
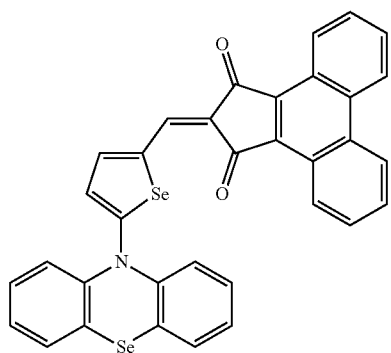

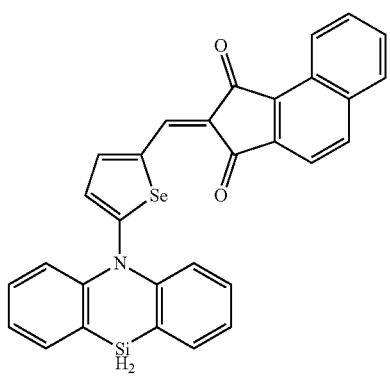
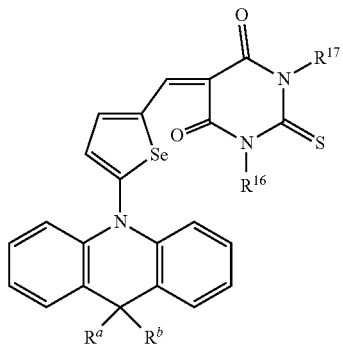

-continued
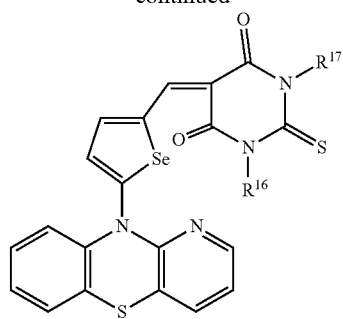
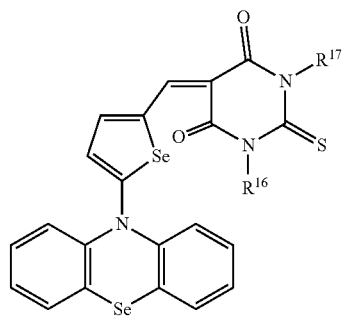
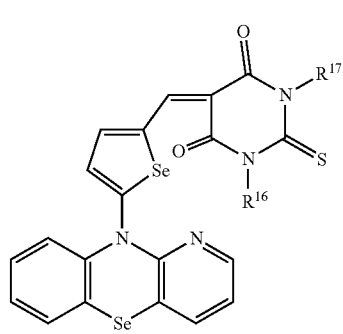
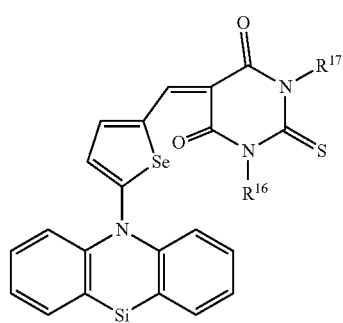
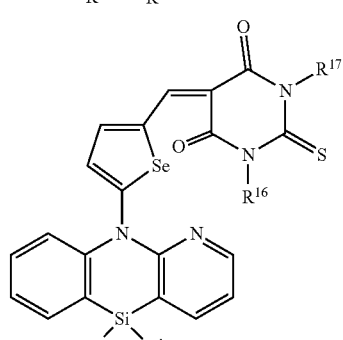
-continued
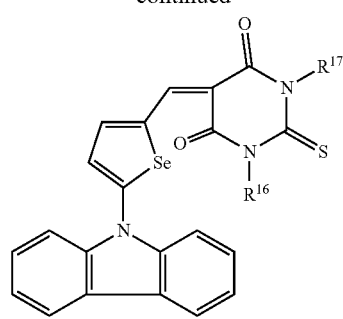
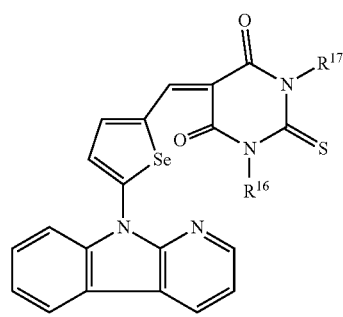
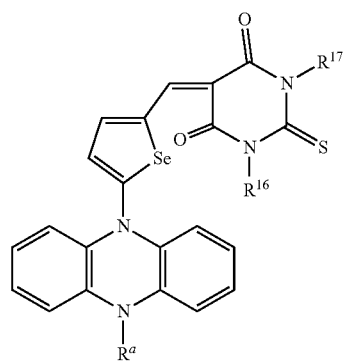
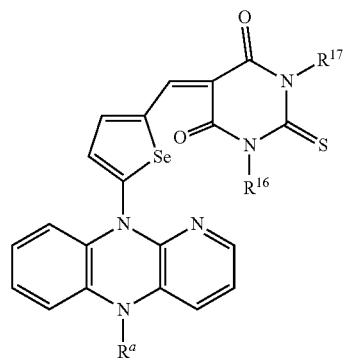

33
-continued
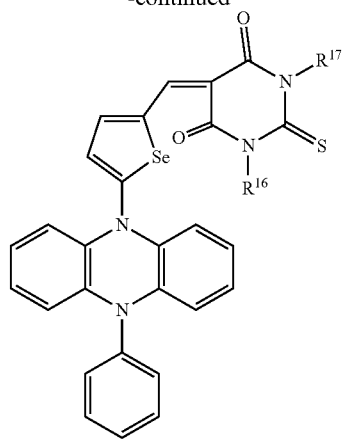
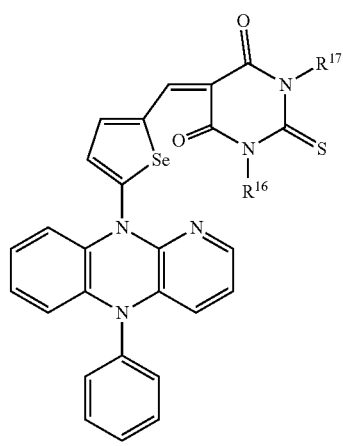
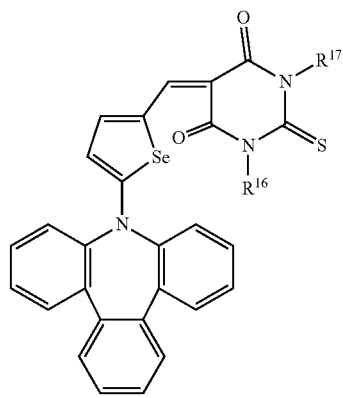
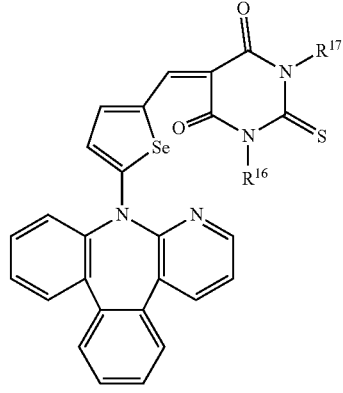
34
-continued
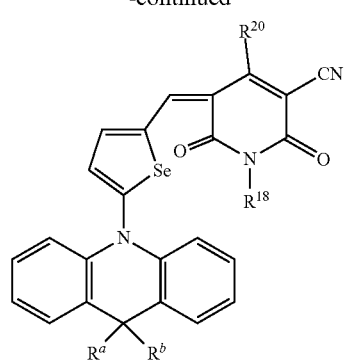
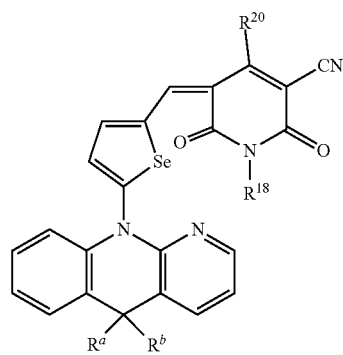
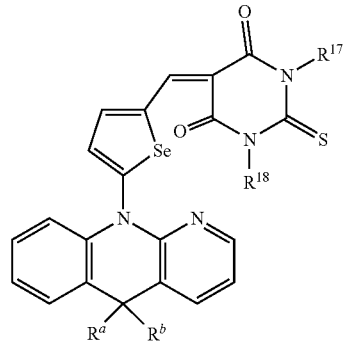
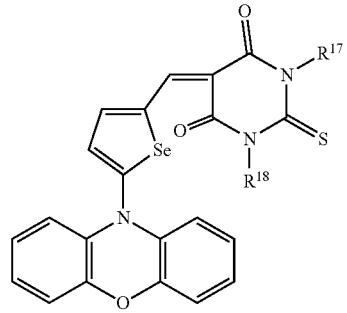
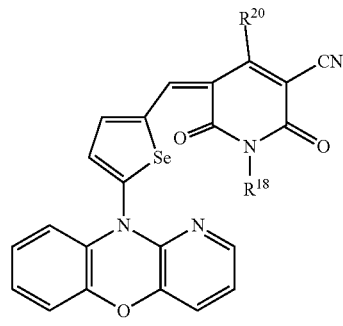

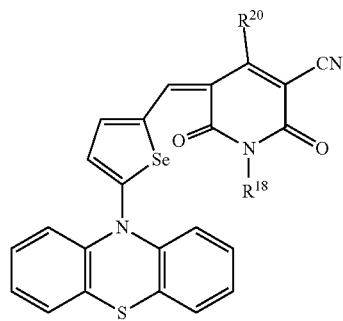
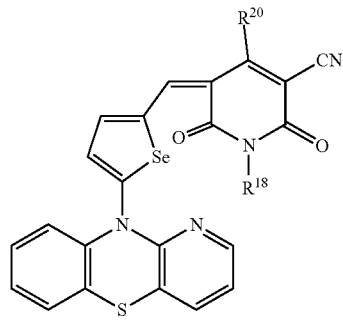
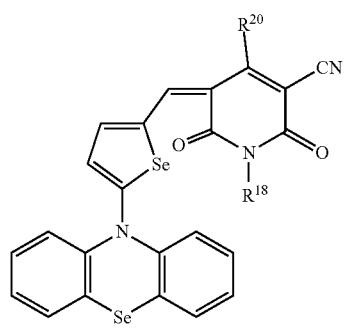
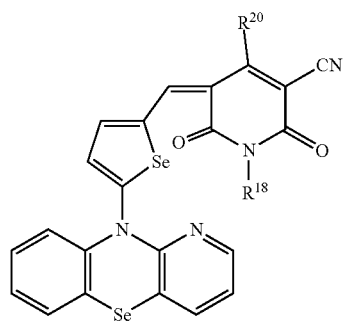
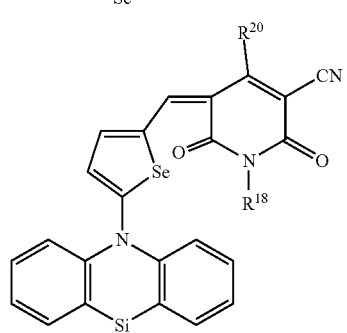
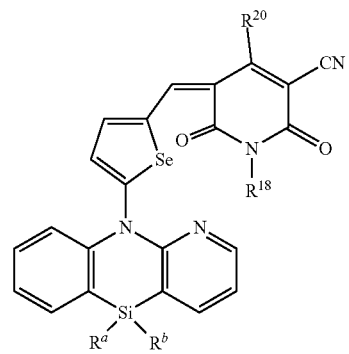
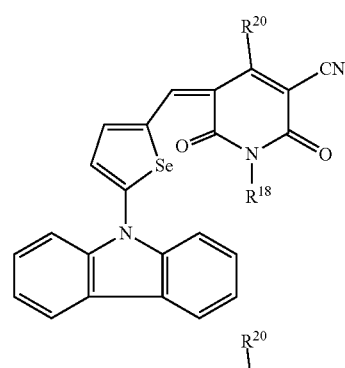
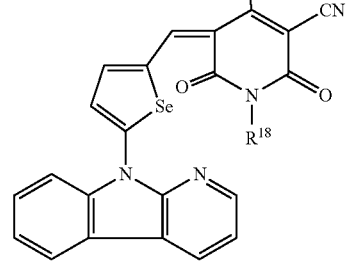
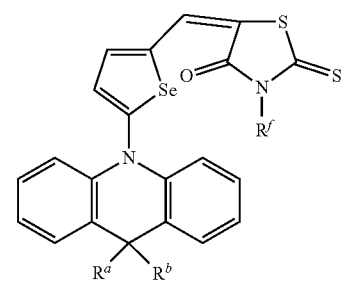
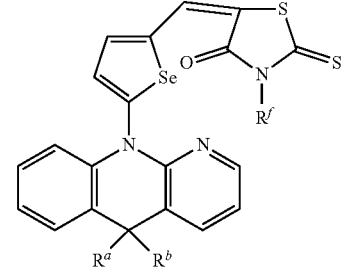

37

-continued

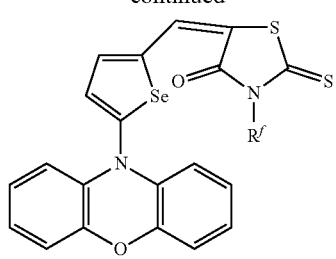

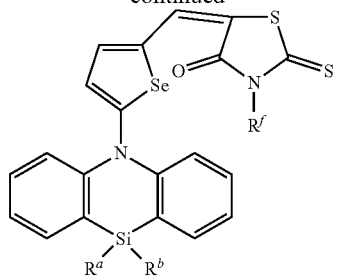

38

-continued

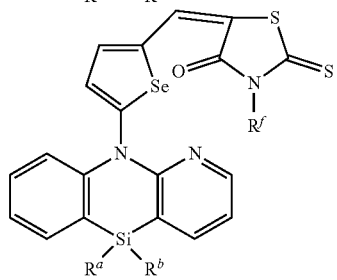

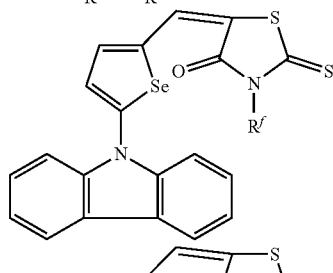

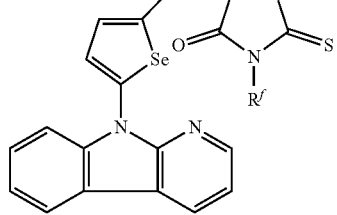

In Group 2A, at least one hydrogen present in each aromatic ring may be replaced by a substituent selected from a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen (F, Cl, Br, or I), a cyano group (–CN), a cyano-containing group, or any combination thereof, and $R^a$, $R^b$, $R^f$, $R^{16}$, $R^{17}$, $R^{18}$, and $R^{20}$ may each independently be hydrogen or a substituted or unsubstituted C1 to C6 alkyl group.

[Group 2B]

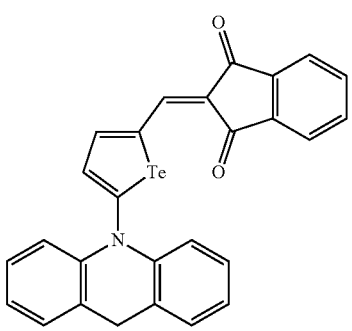

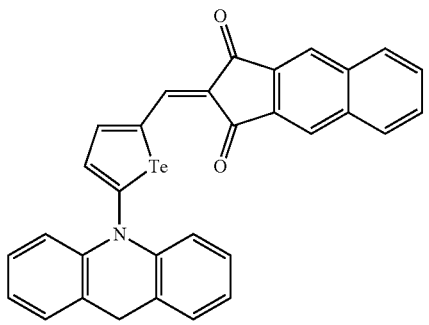
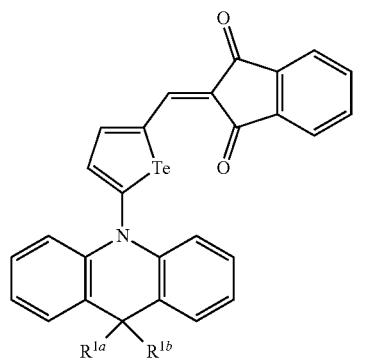
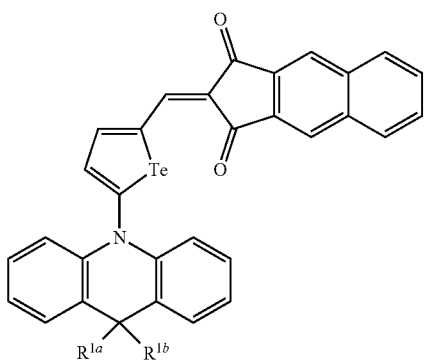
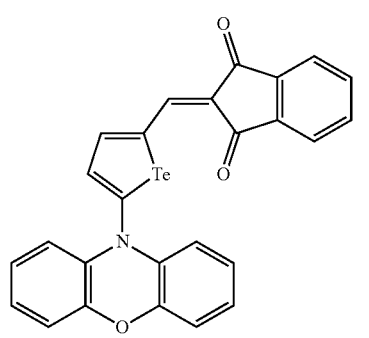
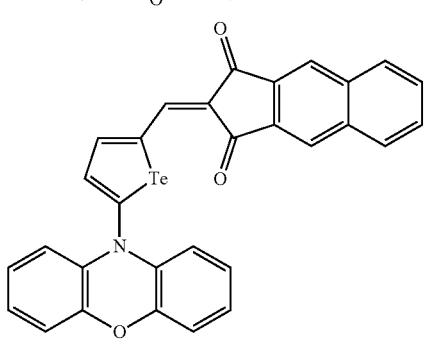
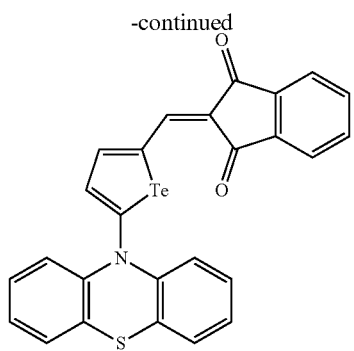
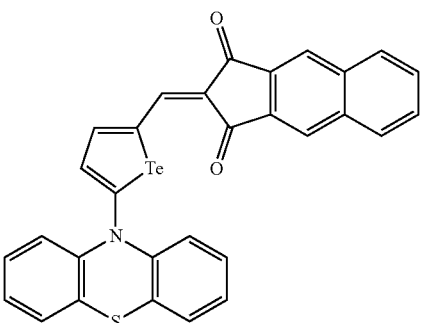
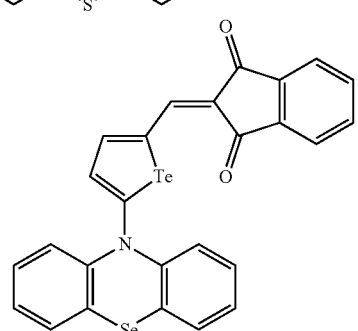
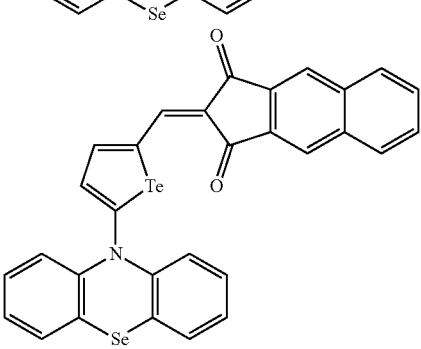
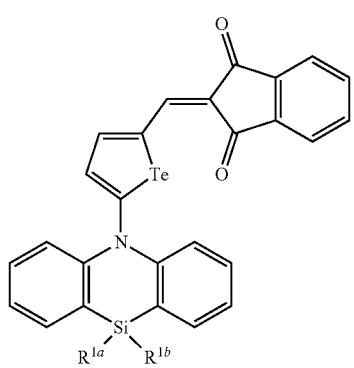

-continued
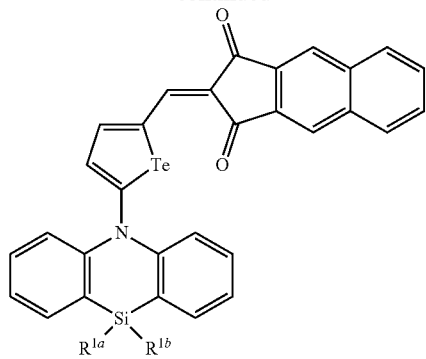
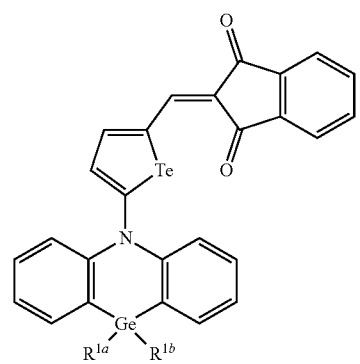
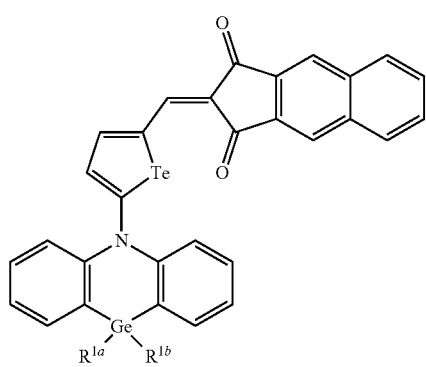
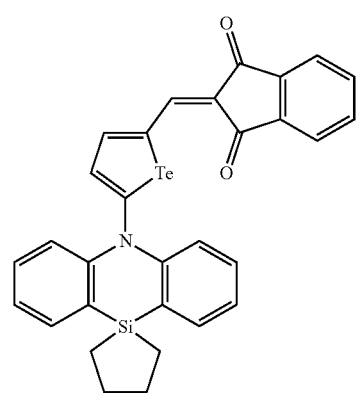
-continued
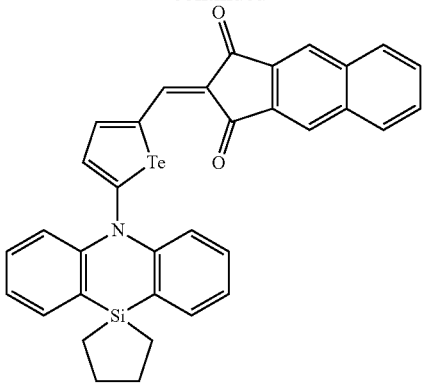
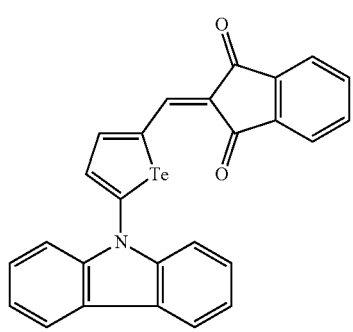
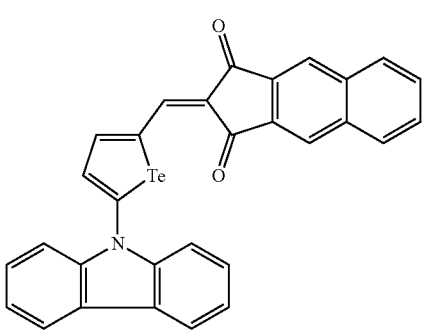
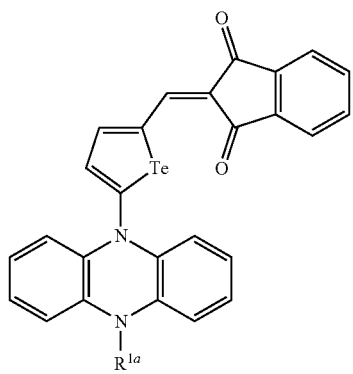

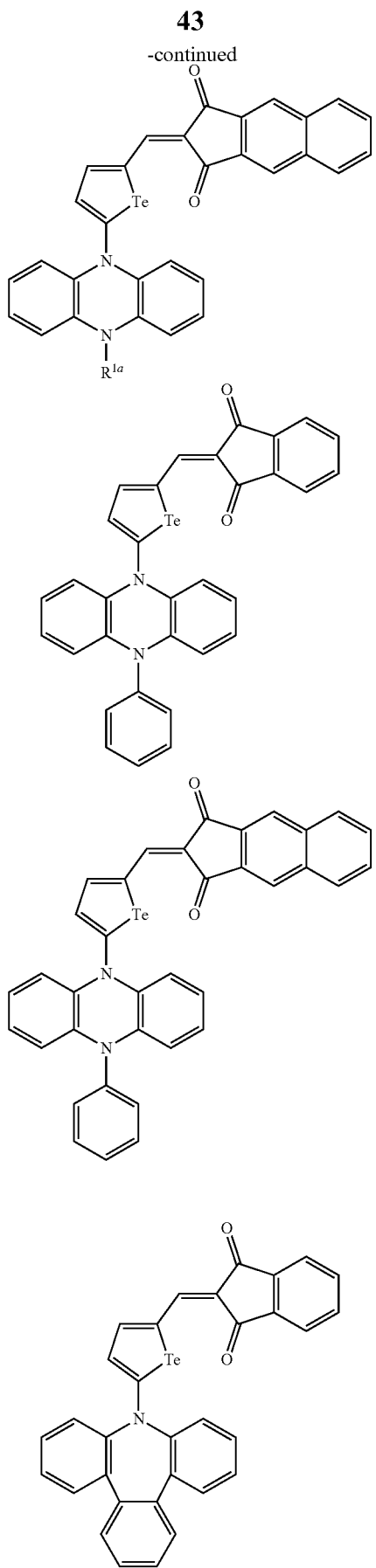
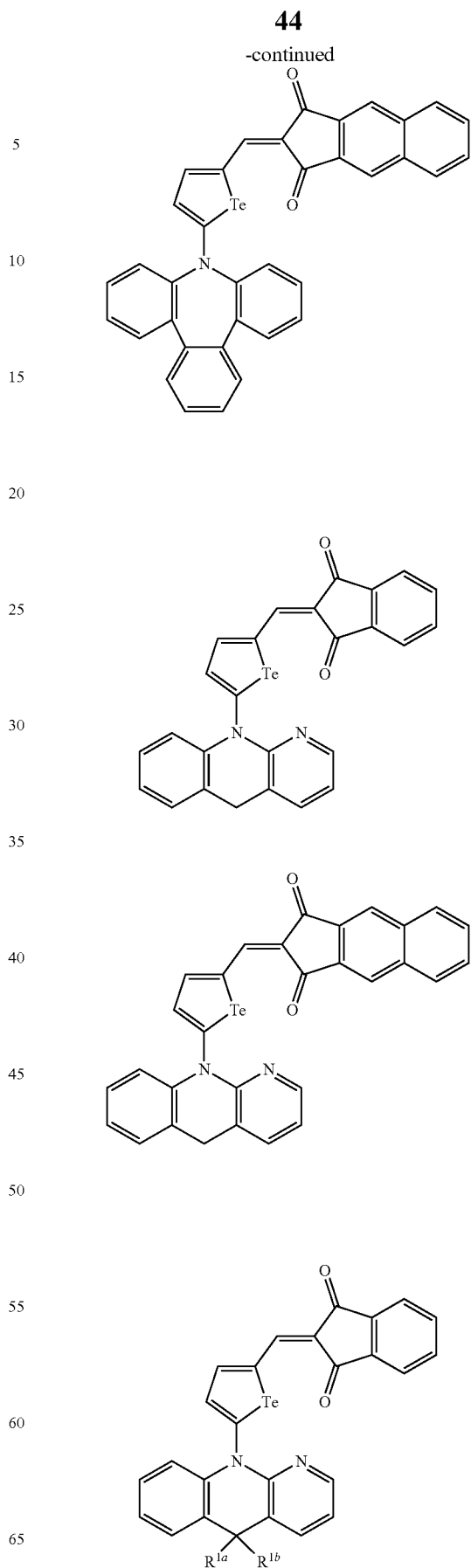

-continued
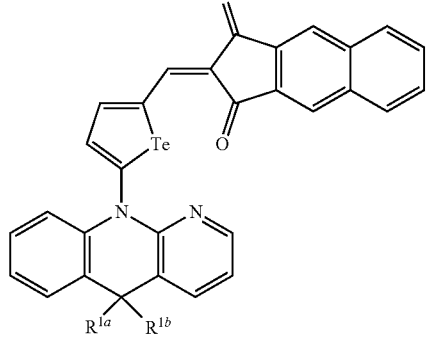
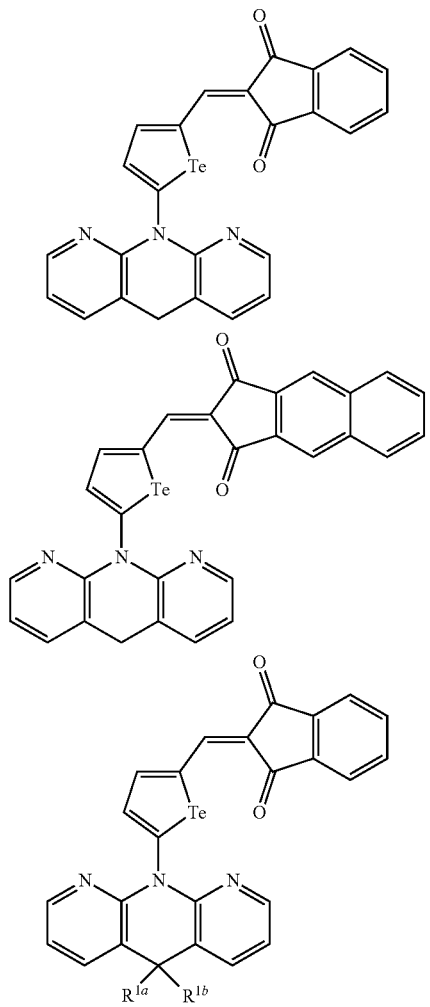
-continued
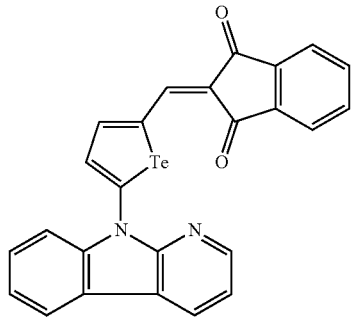
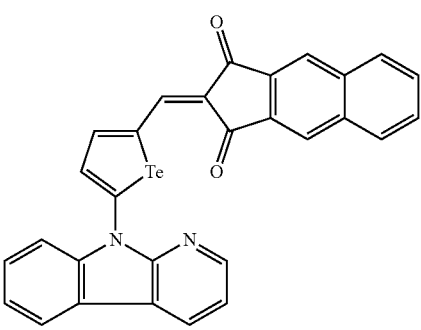
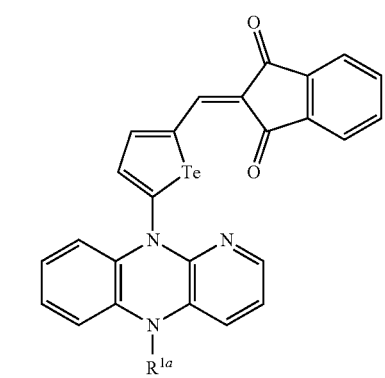
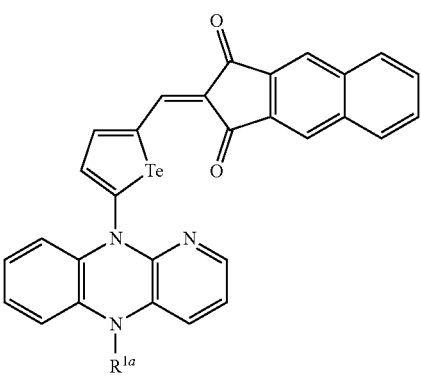

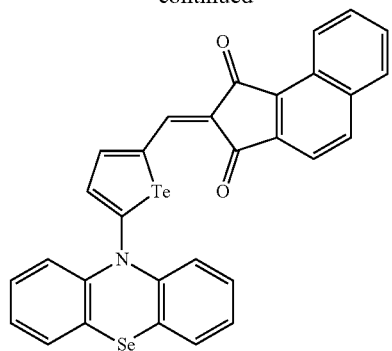
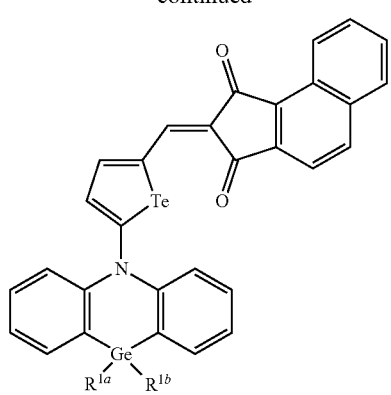
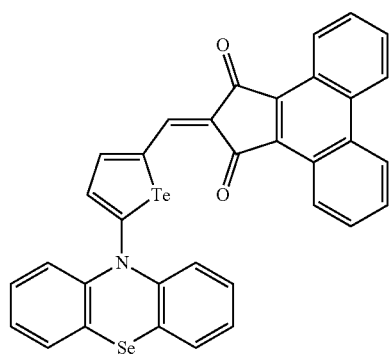
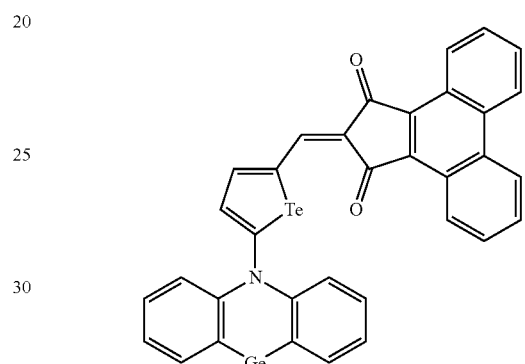
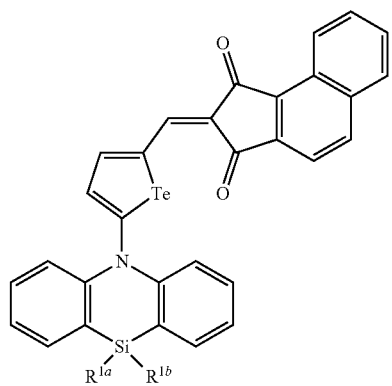
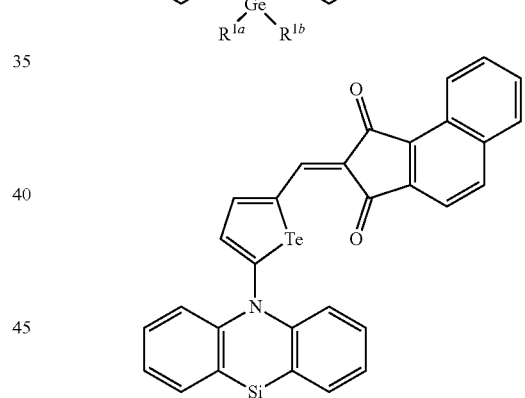
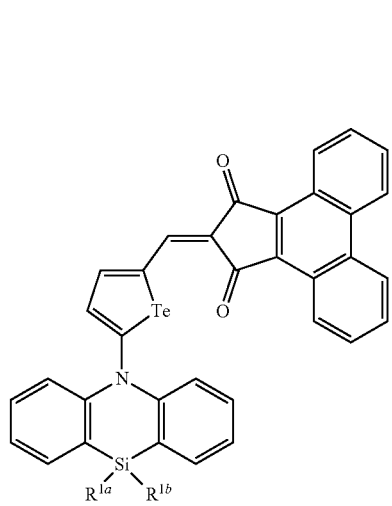
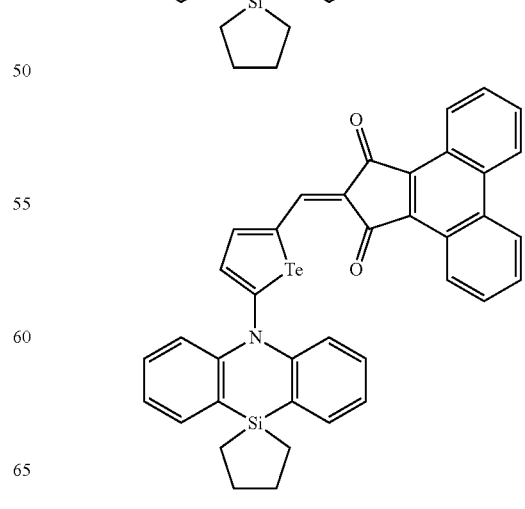

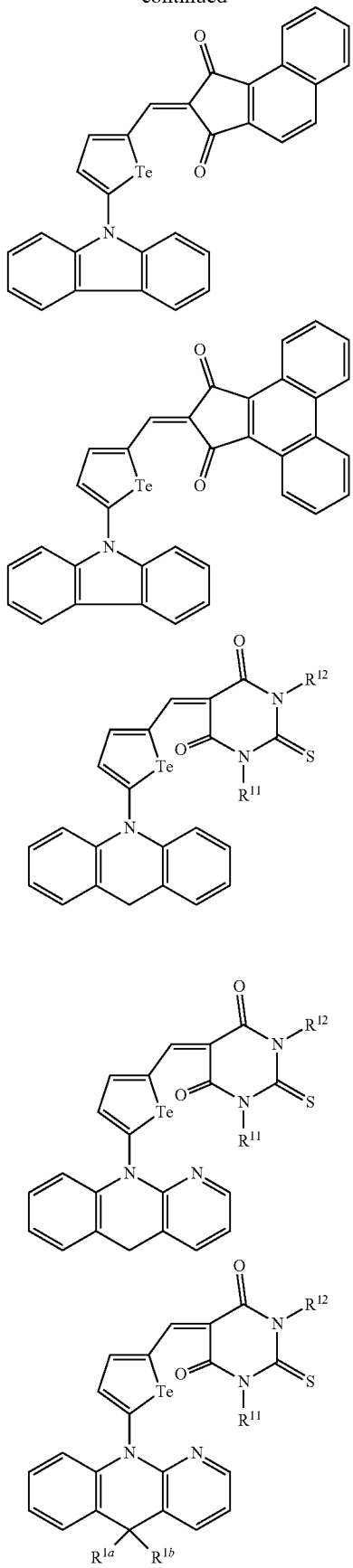
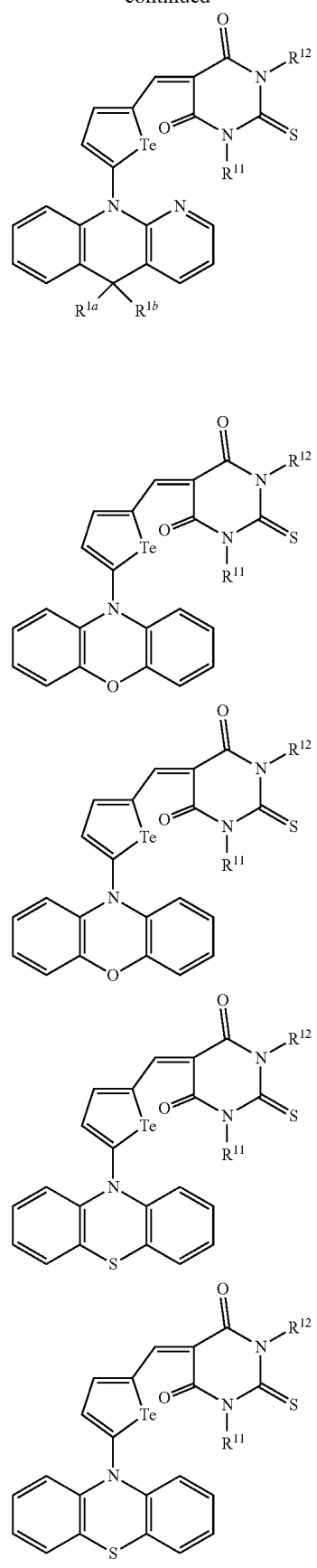

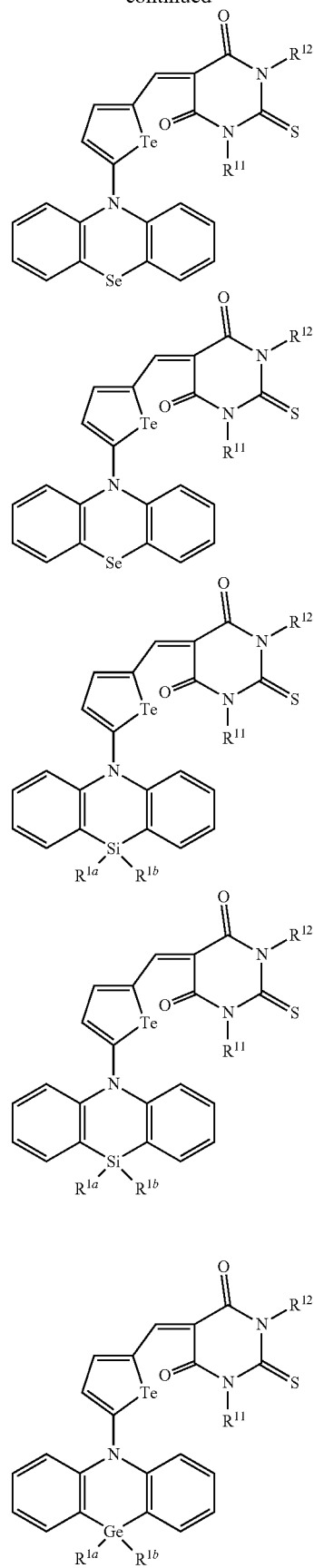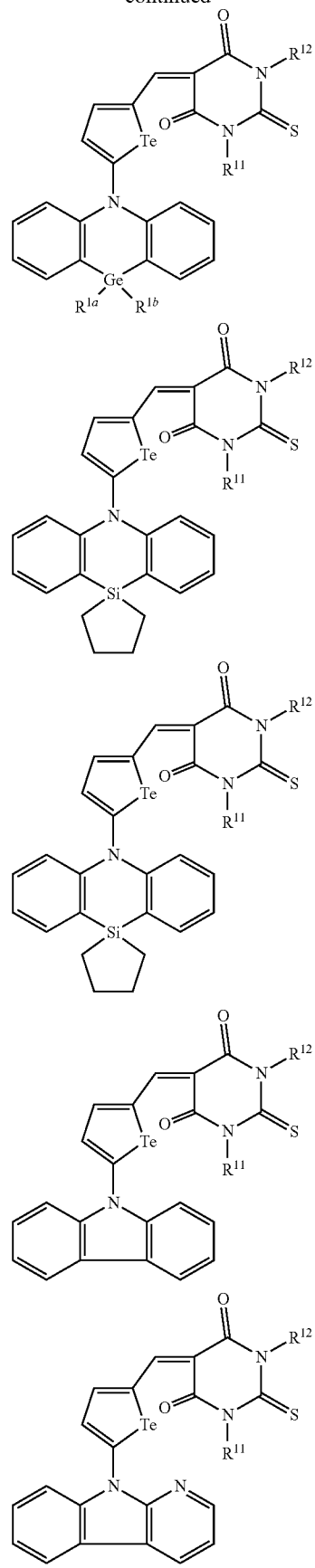

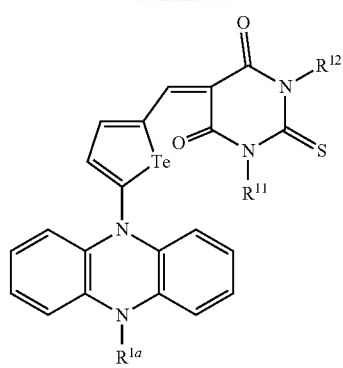
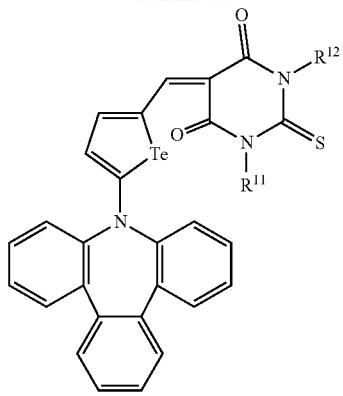

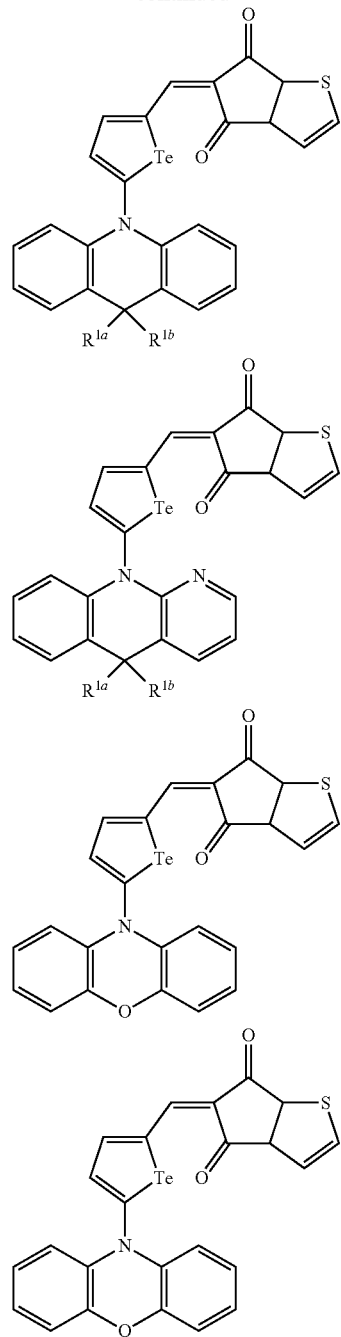
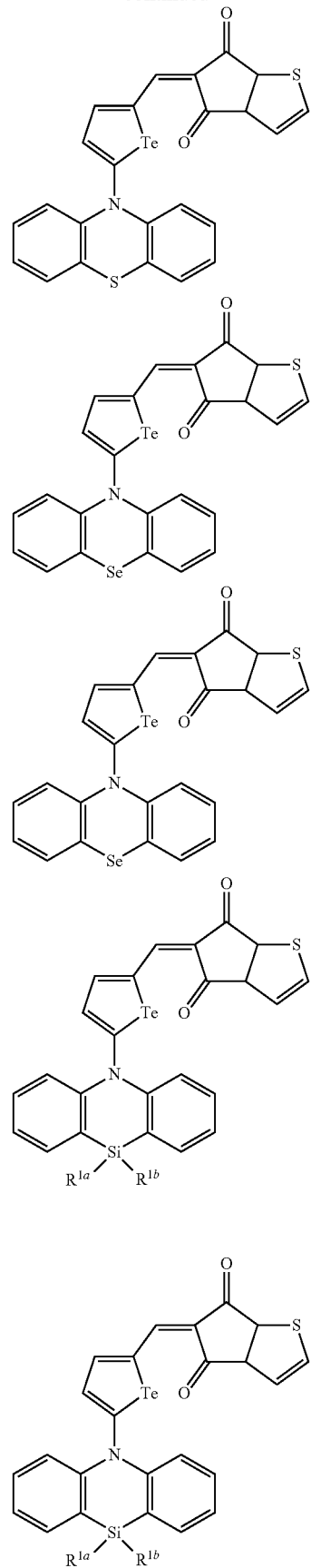

59
-continued
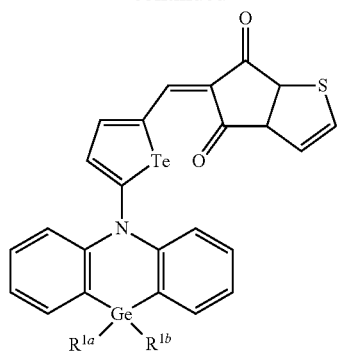
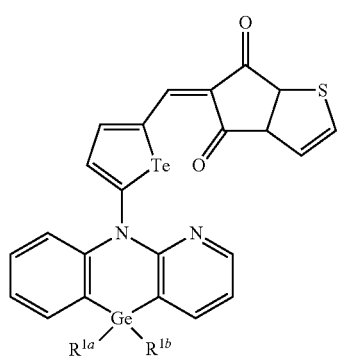
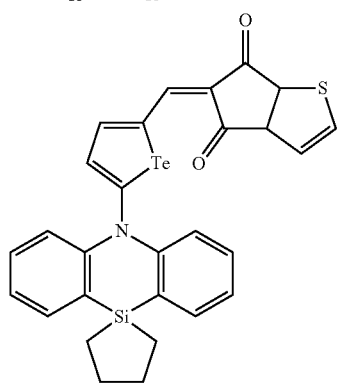
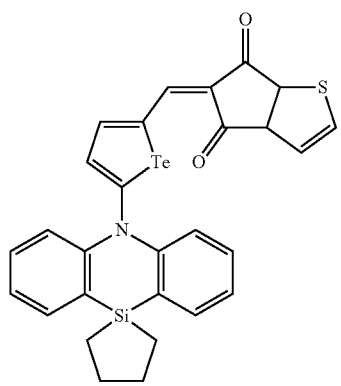
60
-continued
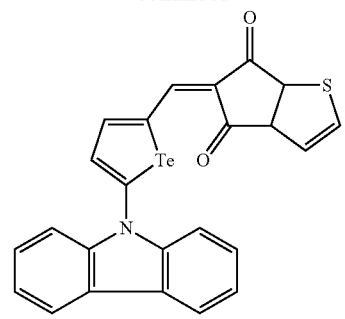
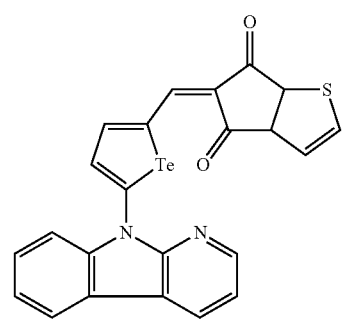
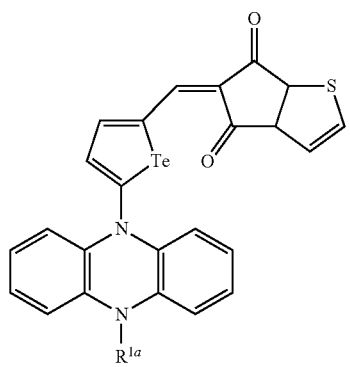
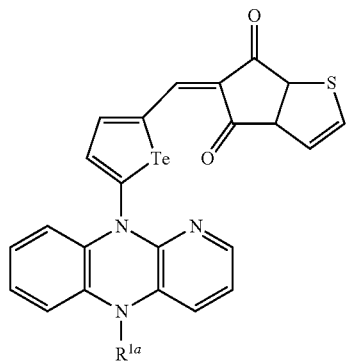

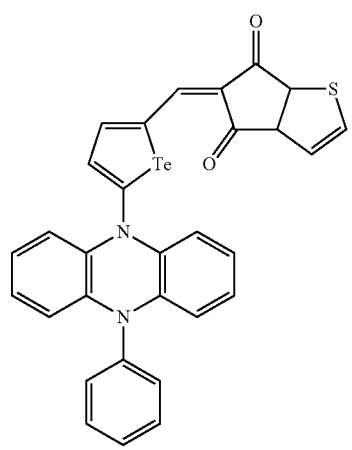
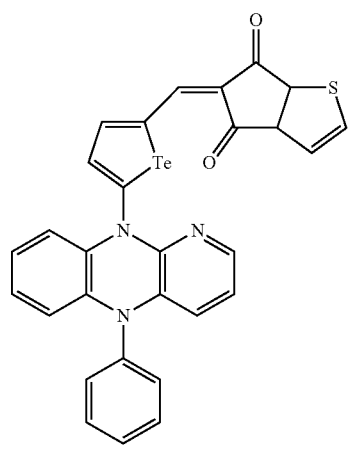
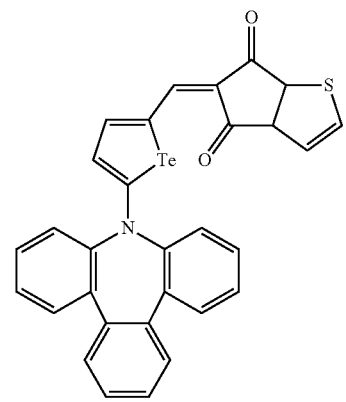
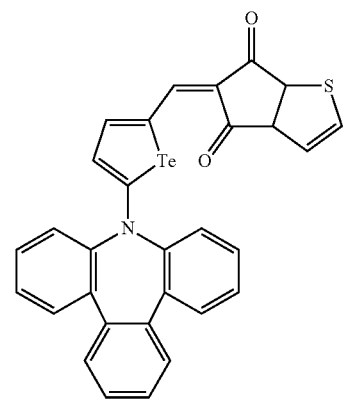
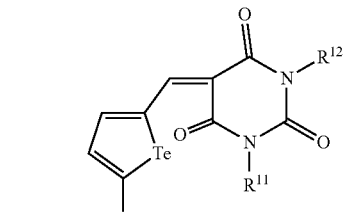
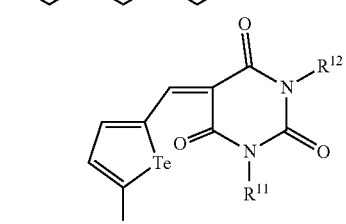
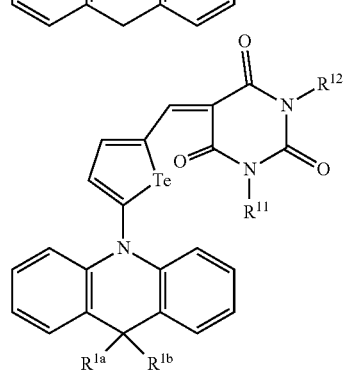
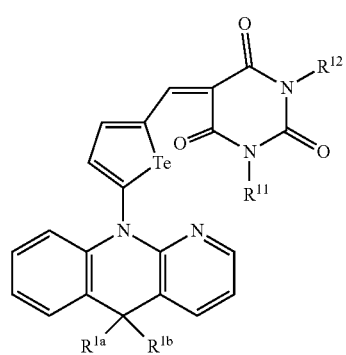
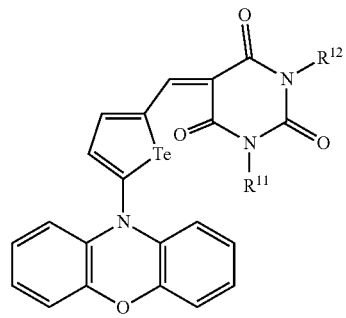

-continued

-continued
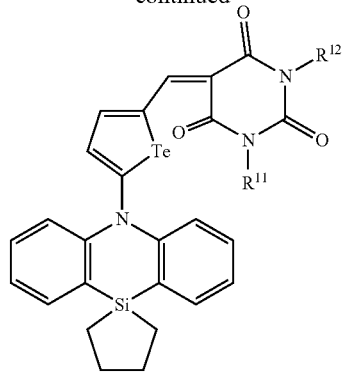
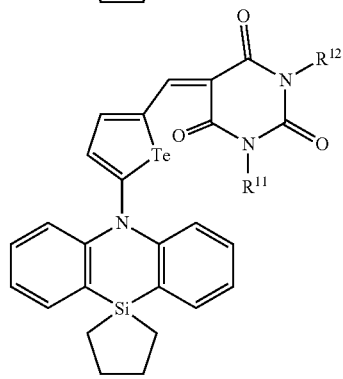
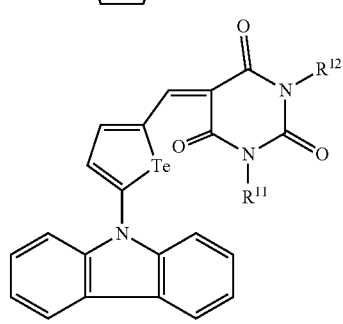
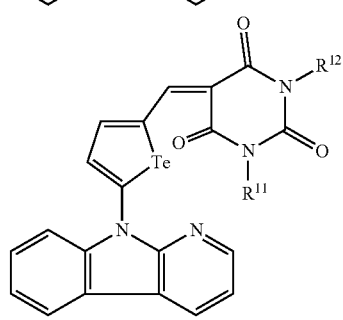
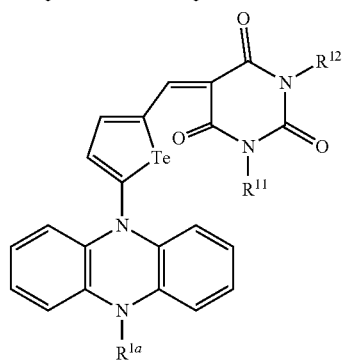
-continued
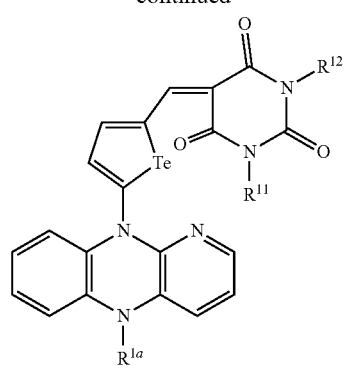
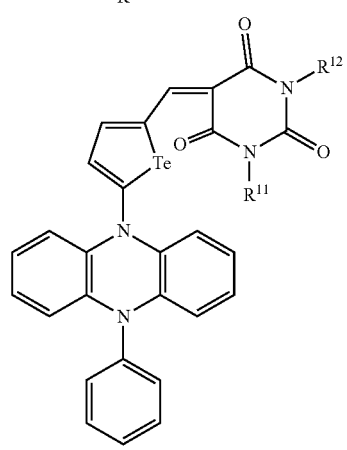
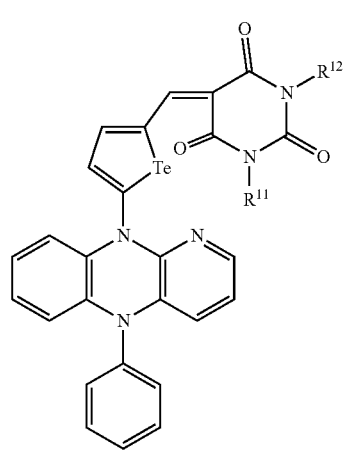
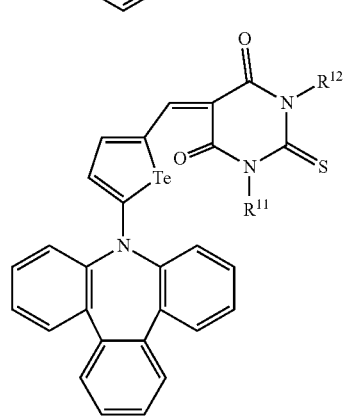

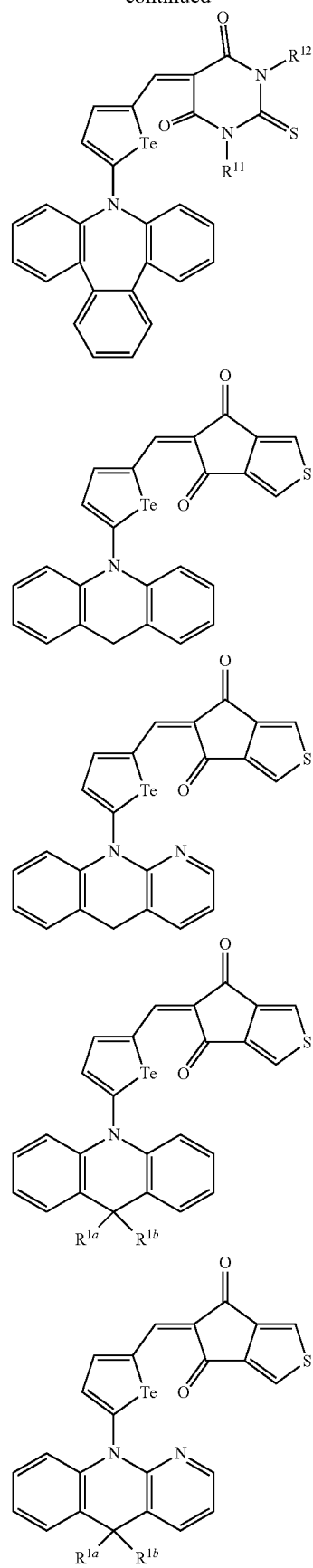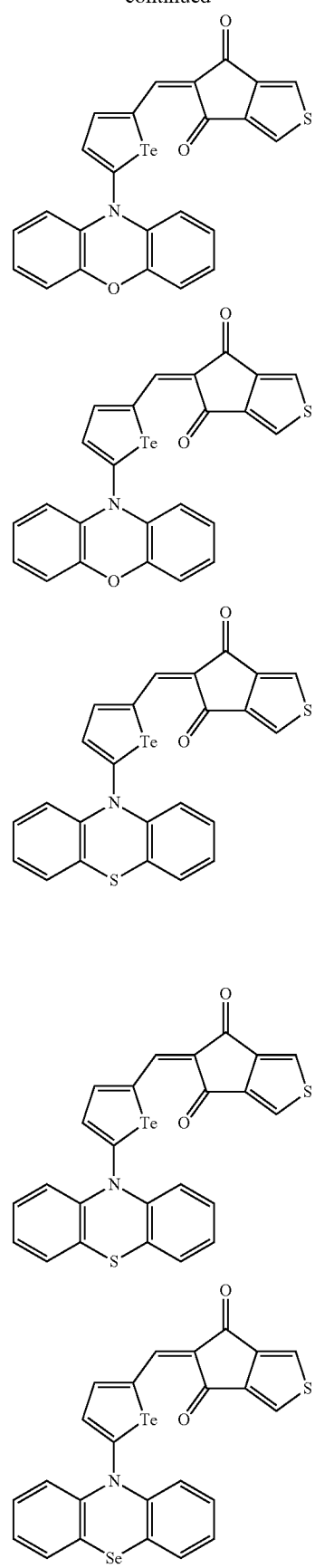

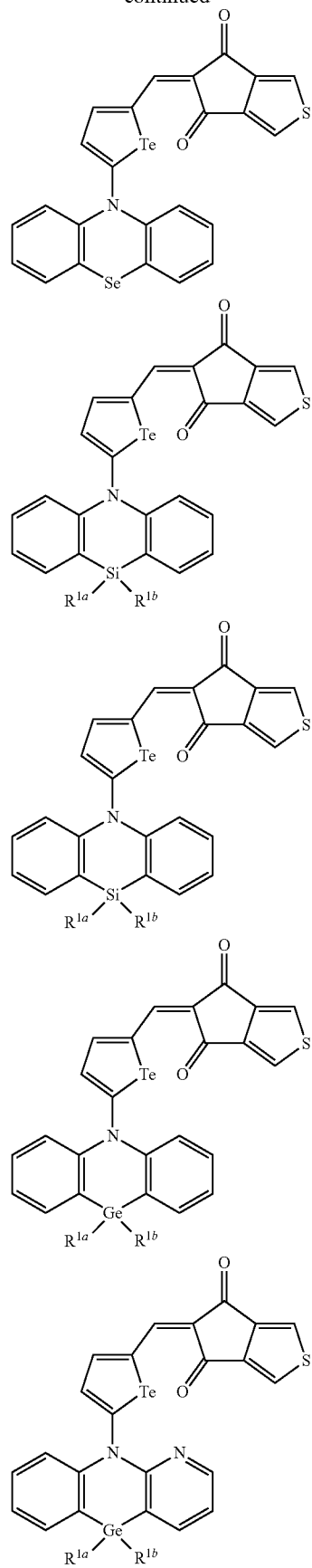
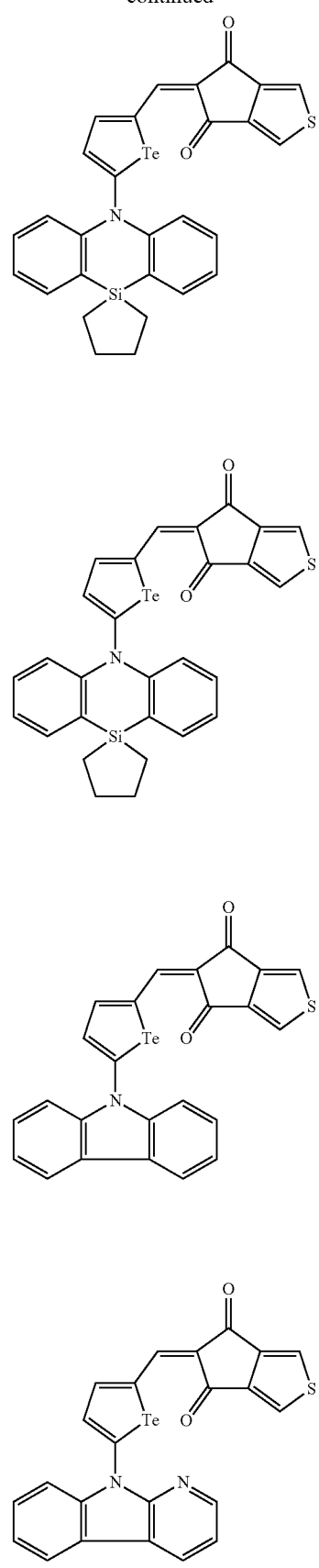

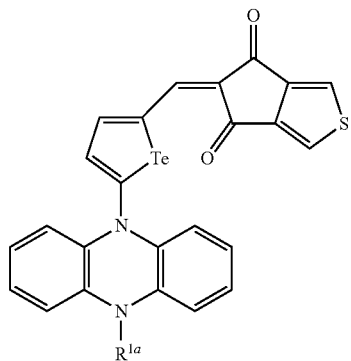
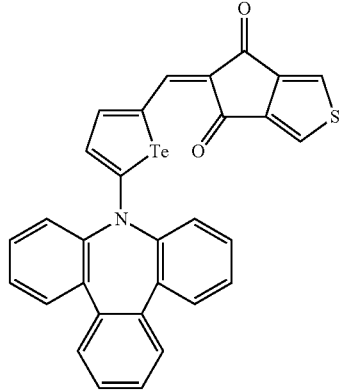
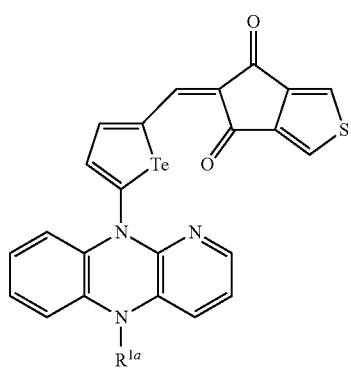
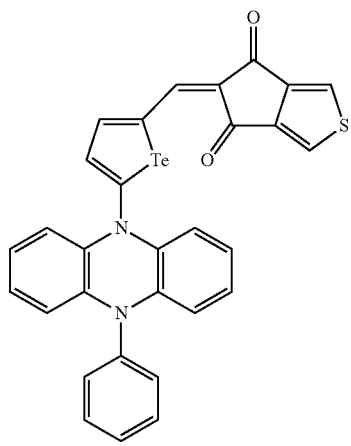
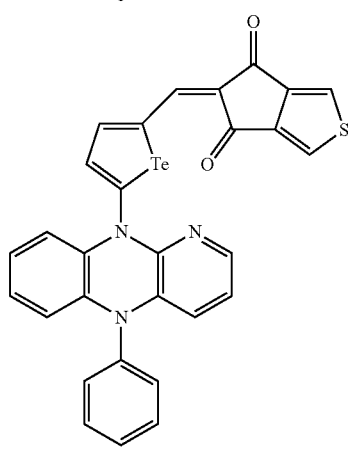
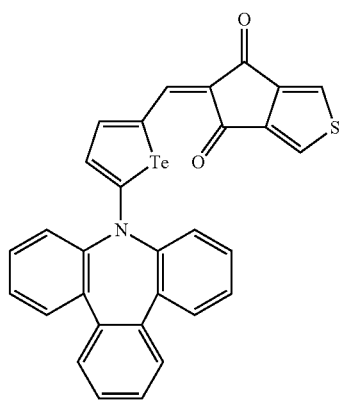

In Group 2B, hydrogen present in each aromatic ring may be replaced by a substituent selected from a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen (F, Cl, Br, or I), a cyano group (—CN), a cyano-containing group, and any combination thereof, and $R^{1a}$, $R^{1b}$, $R^{11}$, and $R^{12}$ may each independently be hydrogen or a C1 to C6 alkyl group.

[Group 2C]

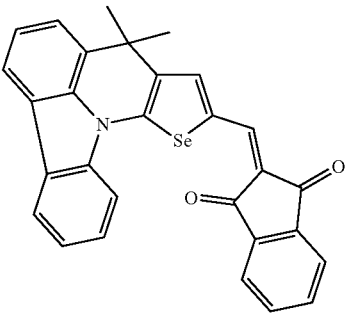

73
-continued
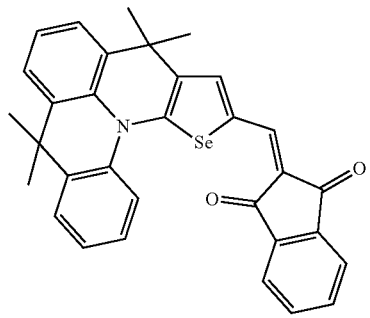
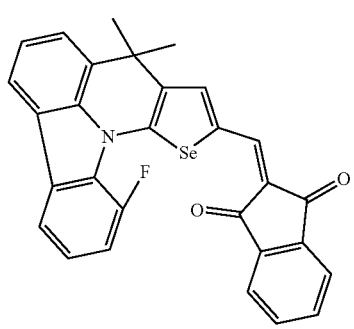
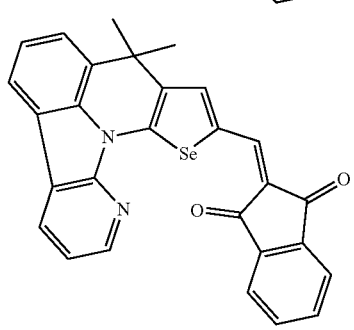
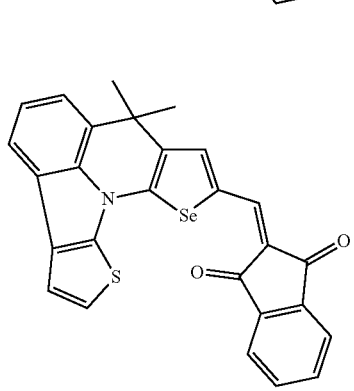
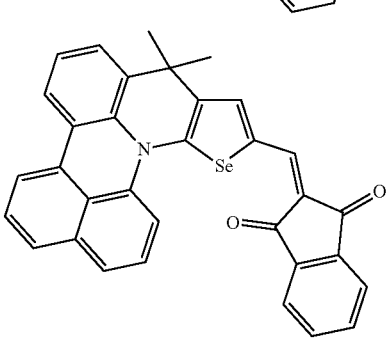
74
-continued
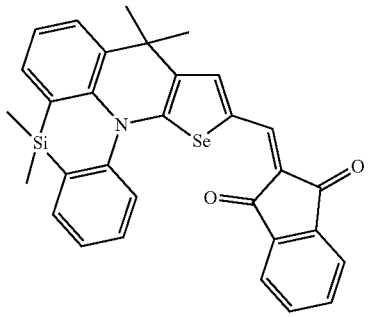
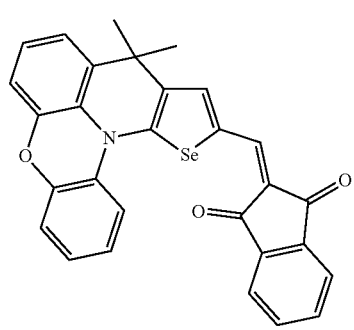
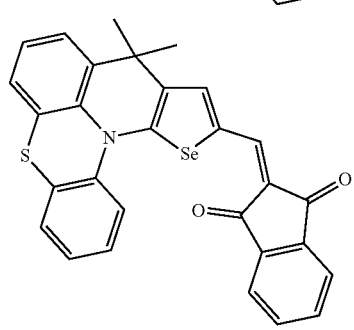
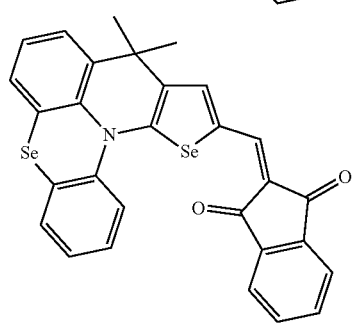
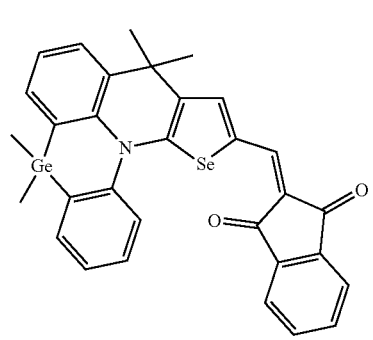

75
-continued
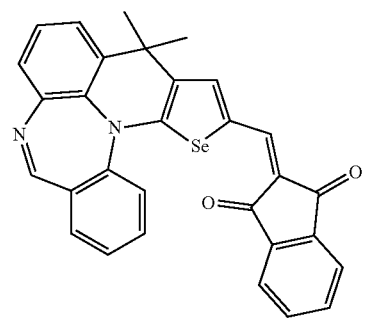
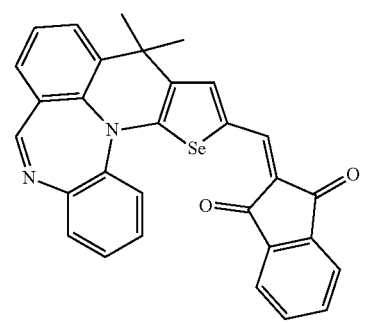
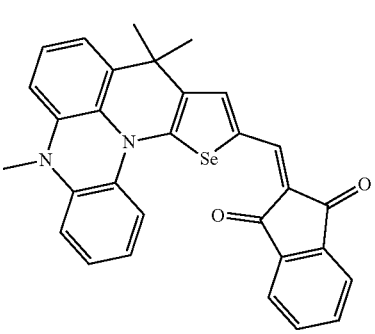
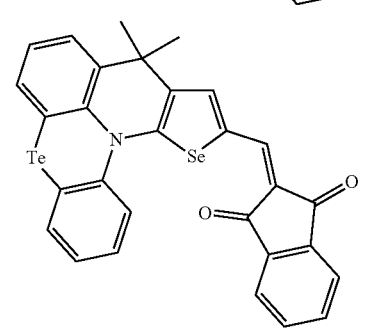
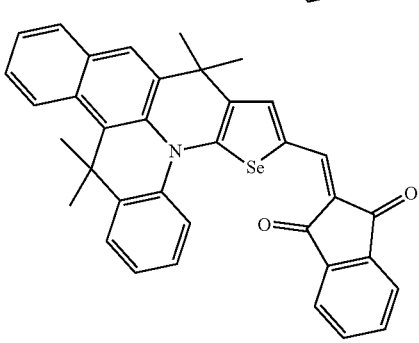
76
-continued
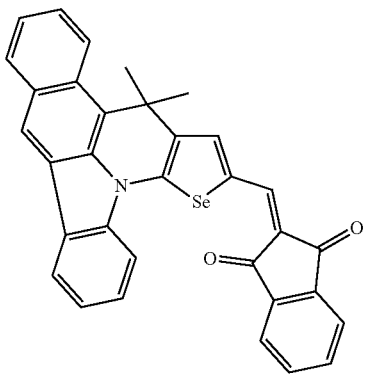
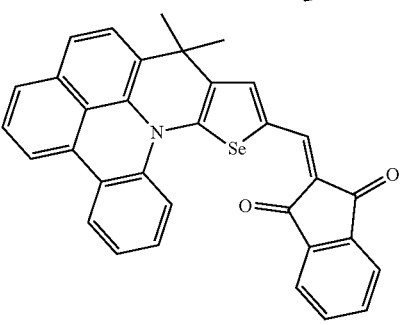
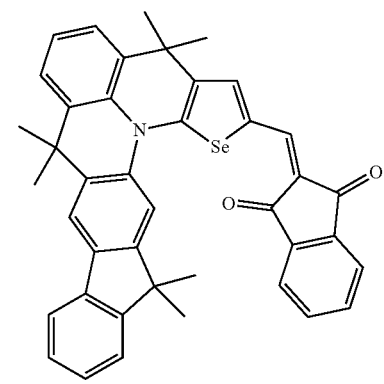
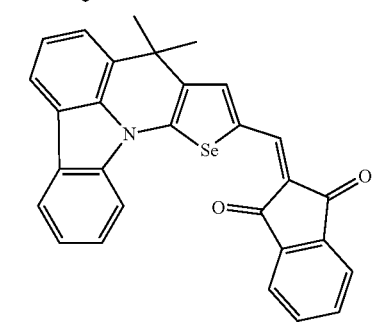
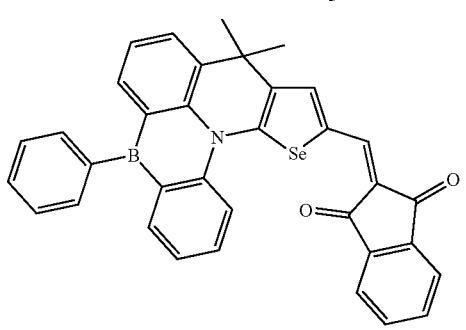

77
-continued
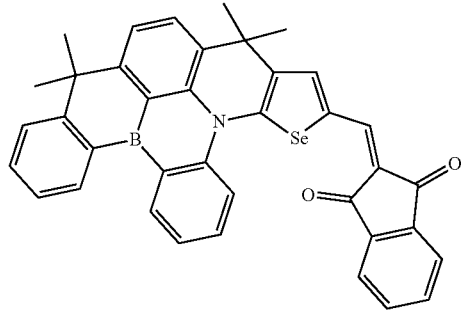
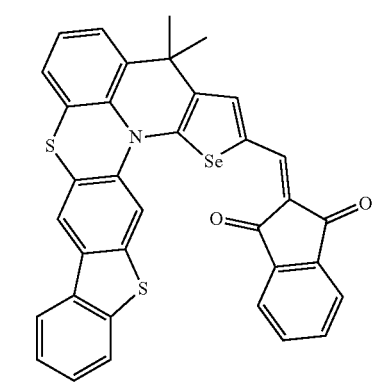
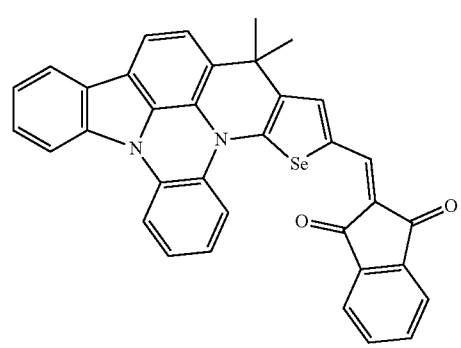
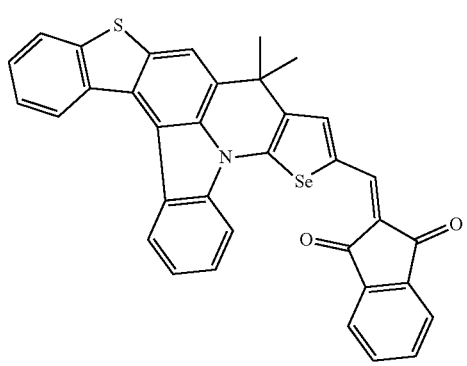
78
-continued
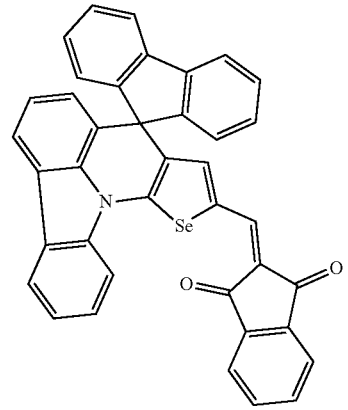
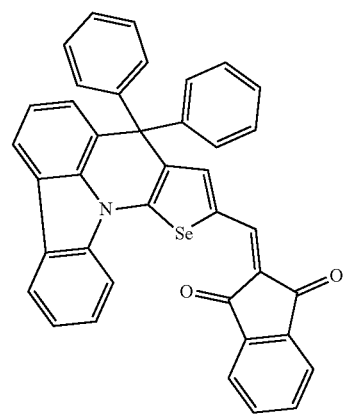
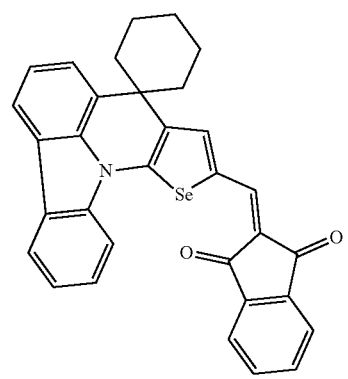
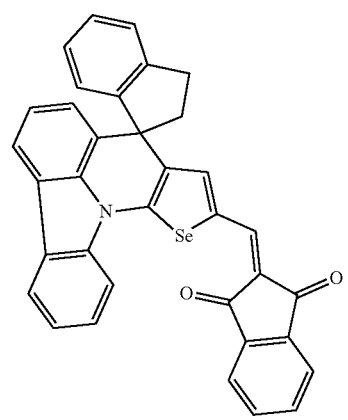

[Group 2D]
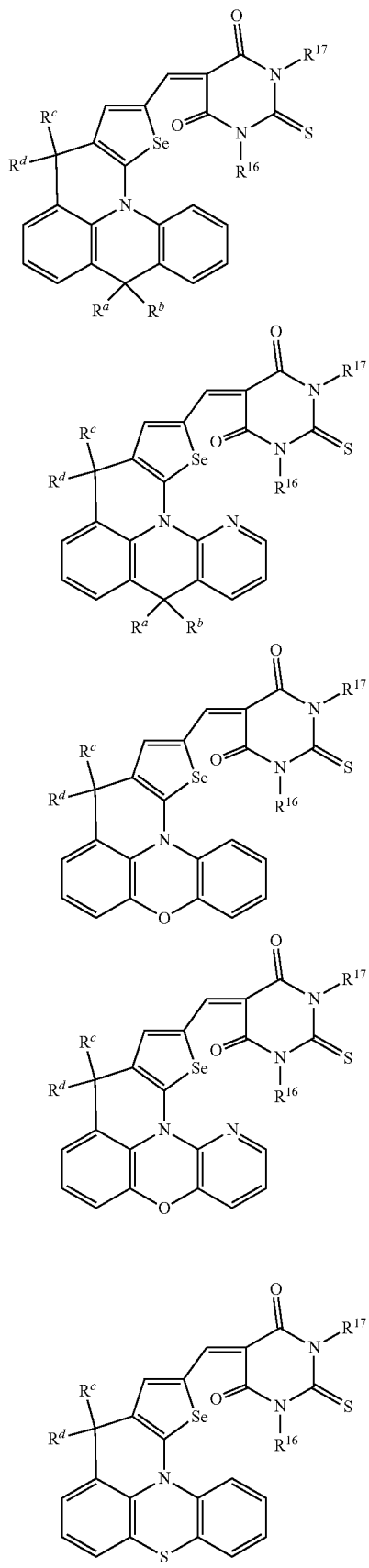
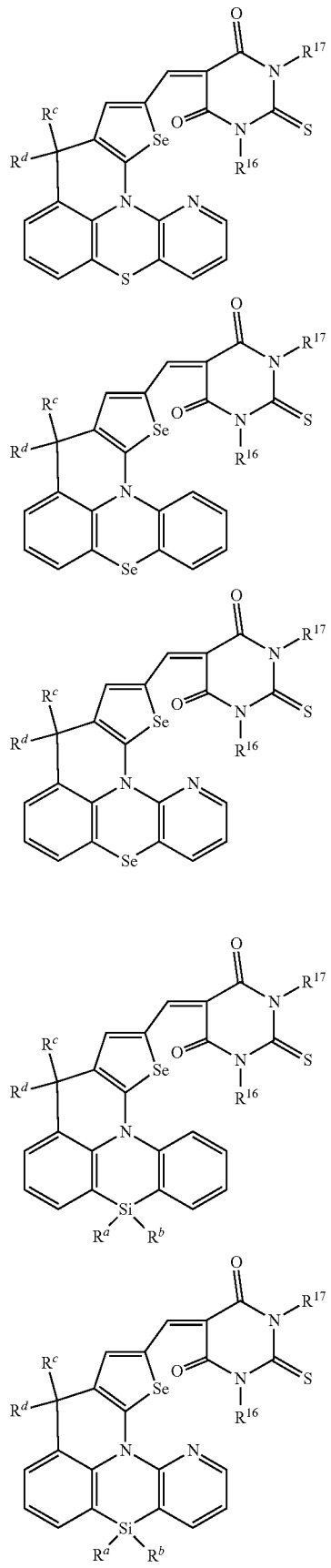

81
-continued
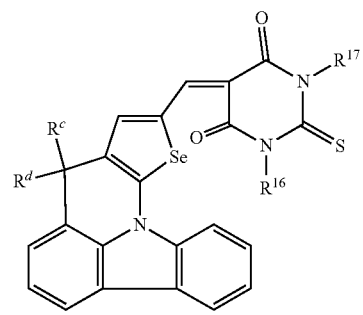
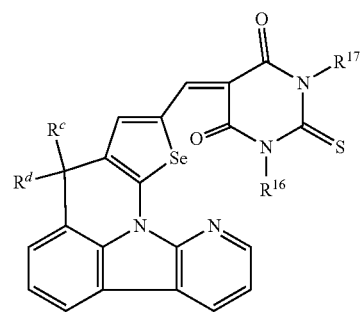
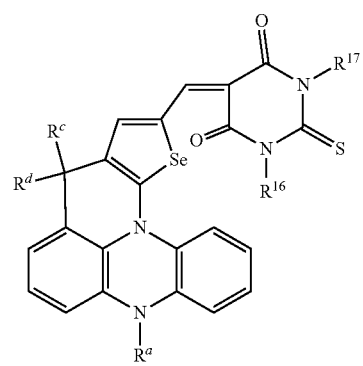
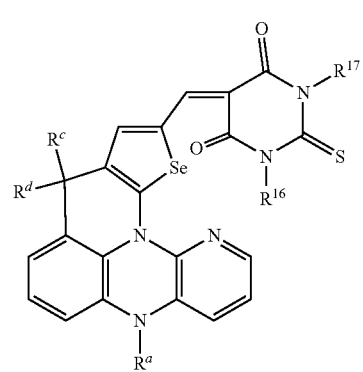
82
-continued
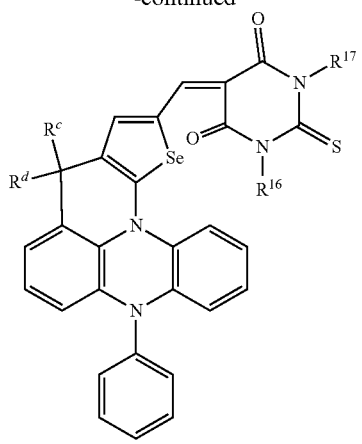
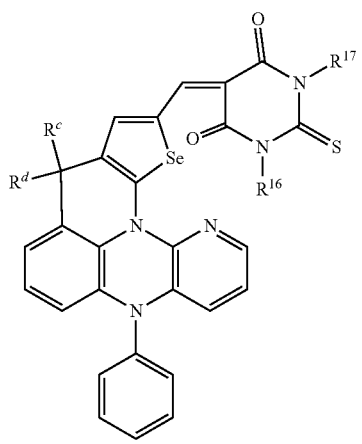
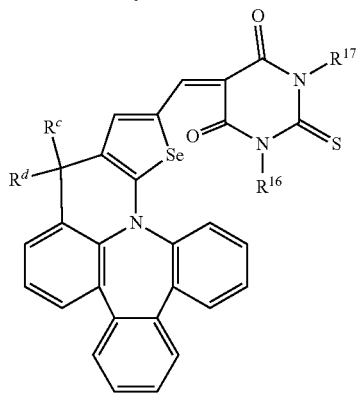
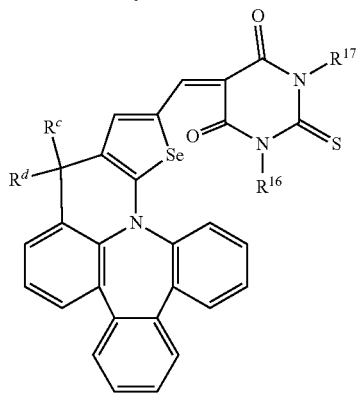

-continued

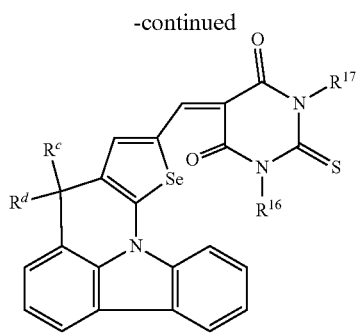

In Groups 2C and 2D, hydrogen present in each aromatic ring may be replaced by a substituent selected from a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen (F, Cl, Br, or I), a cyano group (—CN), a cyano-containing group, and any combination thereof, and $R^a$, $R^b$, $R^c$, $R^d$, $R^{16}$, and $R^{17}$ may each independently be hydrogen or a C1 to C6 alkyl group.

The first n-type semiconductor layer 330p and/or the second n-type semiconductor layer 330q may include n-type semiconductors capable of forming a pn junction with the aforementioned p-type semiconductor, and each n-type semiconductor may be a depositable low molecular organic compound. Each n-type semiconductor included in the first n-type semiconductor layer 330p and the second n-type semiconductor layer 330q may have different optical electrical characteristics. For example, either one of the first n-type semiconductor layer 330p or the second n-type semiconductor layer 330q may include an n-type semiconductor configured to absorb at least a portion of light of a visible light wavelength spectrum, while the other one (e.g., another one) of the first n-type semiconductor layer or the second n-type semiconductor layer may include a transparent n-type semiconductor configured not to absorb or substantially absorb the light of the visible light wavelength spectrum.

For example, the n-type semiconductor included in the first n-type semiconductor layer 330p may be, for example, the transparent n-type semiconductor configured not to absorb or substantially absorb the light of the visible light wavelength spectrum. For example, the first n-type semiconductor layer 330p may have an energy bandgap of greater than or equal to about 2.5 eV and within the range, about 2.5 eV to about 3.5 eV, about 2.7 to about 3.3 eV, or about 2.8 to about 3.2 eV.

A LUMO energy level of the first n-type semiconductor layer 330p may be more shallow (e.g., closer to the vacuum level of 0 eV) than that (e.g., the LUMO energy level) of the second n-type semiconductor layer 330q and similar to that (e.g., the LUMO energy level) of the first common auxiliary layer 340 contacting with an upper surface of the first n-type semiconductor layer 330p. For example, a LUMO energy level difference between the first n-type semiconductor layer 330p and the second n-type semiconductor layer 330q may be greater than or equal to about 0.5 eV and within the range, about 0.5 eV to about 1.2 eV or about 0.7 eV to about 1.2 eV. For example, a LUMO energy level difference between the first n-type semiconductor layer 330p and the first common auxiliary layer 340 may be less than about 1.0 eV and within the range, less than or equal to about 0.9 eV, less than or equal to about 0.8 eV, less than or equal to about 0.7 eV, or less than or equal to about 0.5 eV, greater than or equal to about 0 eV and less than about 1.0 eV, about 0 eV to about 0.9 eV, about 0 eV to about 0.8 eV, about 0 eV to about 0.7 eV, about 0 eV to about 0.5 eV, greater than or equal to about 0.01 eV to less than about 1.0 eV, about 0.01 eV to about 0.9 eV, about 0.01 eV to about 0.8 eV, about 0.01 eV to about 0.7 eV, or about 0.01 eV to about 0.5 eV.

The first n-type semiconductor layer 330p has the optical electrical characteristics and thus may have no influence or no substantial influence on the light absorption characteristics of the photoelectric conversion layer 330 in a visible light wavelength spectrum but make charge carriers generated in the photoelectric conversion layer 330 (e.g., electrons) pass the first common auxiliary layer 340 and effectively transferred and/or extracted toward the common electrode 320.

The n-type semiconductor included in the first n-type semiconductor layer 330p may be, for example, fullerene such as $C_{60}$, $C_{70}$, $C_{78}$, and $C_{80}$ or a fullerene derivative; thiophene or a thiophene derivative; or any combination thereof but is not limited thereto.

For example, the n-type semiconductor included in the second n-type semiconductor layer 330q may be configured to absorb at least a portion of light of a visible light wavelength spectrum. For example, the second n-type semiconductor layer 330q may be configured to absorb light of a red wavelength spectrum, a green wavelength spectrum, a blue wavelength spectrum, or any combination thereof. For example, an energy bandgap of the second n-type semiconductor layer 330q may be smaller than that of the first n-type semiconductor layer 330p, for example, less than about 2.5 eV and within the range, about 1.9 eV to about 2.4 eV or about 1.9 eV to about 2.3 eV.

As described above, the LUMO energy level of the first n-type semiconductor layer 330p may be more shallow (e.g., closed to a vacuum level of 0 eV) than that of the second n-type semiconductor layer 330q, and a LUMO energy level difference between the second n-type semiconductor layer 330q and the first n-type semiconductor layer 330p may be greater than or equal to about 0.5 eV and within the range, about 0.5 eV to about 1.2 eV or about 0.7 eV to about 1.2 eV. In addition, a LUMO energy level difference of the second n-type semiconductor layer 330q and the first common auxiliary layer 340 may be larger than that of the first n-type semiconductor layer 330p and the first common auxiliary layer 340, for example, greater than or equal to about 0.5 eV and within the range, about 0.5 eV to about 1.2 eV or about 0.7 eV to about 1.2 eV. For example, a difference between the LUMO energy level of the first n-type semiconductor layer 330p and the first common auxiliary layer 340 may be smaller than a difference between the LUMO energy level of the second n-type semiconductor layer 330q and the first common auxiliary layer 340. For example, a difference between the LUMO energy level of the first n-type semiconductor layer 330p and the LUMO energy level of the first common auxiliary layer 340 may be about 0 eV to about 1.0 eV, and a difference between the LUMO energy level of the second n-type semiconductor layer 330q and the LUMO energy level of the first common auxiliary layer 340 may be about 0.5 eV to about 1.2 eV.

The n-type semiconductor included in the second n-type semiconductor layer 330q may be, for example, a non-fullerene low molecular material, for example, a planar type core having an imide group or an anhydride group, for example, naphthalene tetracarboxylic dianhydride, a substituted or unsubstituted naphthalene diimide, a substituted or unsubstituted anthracene diimide, a substituted or unsubstituted pyrene diimide, a substituted or unsubstituted perylene diimide, or any combination thereof, but is not limited thereto.

A thickness of the second n-type semiconductor layer 330q may be thinner than that of the first n-type semiconductor layer 330p, for example, respectively thinner than that of the p-type semiconductor layer 330r and that of the first n-type semiconductor layer 330p. For example, the thickness of the second n-type semiconductor layer 330q may be less than or equal to about 10 nm and within the range, less than or equal to about 8 nm, less than or equal to about 7 nm, or less than or equal to about 5 nm, for example, about 1 nm to about 10 nm, about 1 nm to about 8 nm, about 1 nm to about 7 nm, or about 1 nm to about 5 nm. As described herein, a thickness of a layer, element or the like may be a thickness of the layer, element, or the like in a vertical direction that is perpendicular to the in-plane direction of the substrate 110, perpendicular to the upper surface 110S of the substrate 110, perpendicular to the xy direction (e.g., the z direction), or the like.

The respective and/or combined thicknesses of the p-type semiconductor layer 330r and the first n-type semiconductor layer 330p may be greater than about 10 nm and less than or equal to about 200 nm and within the range, about 15 nm to about 200 nm, about 20 nm to about 150 nm, about 20 nm to about 100 nm, or about 20 nm to about 80 nm.

The photoelectric conversion layer 330 has a structure of sequentially stacking the first n-type semiconductor layer 330p, the second n-type semiconductor layer 330q, and the p-type semiconductor layer 330r (e.g., from the first common auxiliary layer 340) and thus may compensate for electrical mismatching between the photoelectric conversion layer 330 and the first common auxiliary layer 340 and thus improve photoelectric conversion efficiency and simultaneously, lower a dark current in the photosensor 300.

As described above, the first common auxiliary layer 340 may have electrical characteristics that facilitate injection and/or movement of charge carriers (e.g., electrons) from the common electrode 320 to the light emitting layers 212, 222, 232 of the first, second, and third light emitting elements 210, 220, and 230, whereas such electrical characteristics of the first common auxiliary layer 340 cannot be applied equally to the case between the photoelectric conversion layer 330 and the common electrode 320 of the photosensor 300.

That is, the first, second, and third light emitting elements 210, 220, and 230 and the photosensor 300 have different directions of movement of electric charge carriers (e.g., electrons), and the light emitting layers 212, 222, 232 and the photoelectric conversion layer 330 also have different electrical characteristics. Unlike the role of the first common auxiliary layer 340 that facilitates the injection and/or movement of charge carriers (e.g., electrons) from the common electrode 320 to the light emitting layers 212, 222, and 232 in the first, second, and third light emitting element 210, 220, and 230, in the photosensor 300, the first common auxiliary layer 340 between the photoelectric conversion layer 330 and the common electrode 320 may act as a barrier to prevent movement and/or extraction of charge carriers (e.g., electrons) from the photoelectric conversion layer 330 to the common electrode 320, and thus may deteriorate electrical characteristics of the photosensor 300.

The aforementioned first n-type semiconductor layer 330p, second n-type semiconductor layer 330q, and p-type semiconductor layer 330r may compensate for this electrical mismatching and thus make charge carriers (e.g., electrons) generated from the photoelectric conversion layer 330 pass the first common auxiliary layer 340 and effectively transferred and/or extracted toward the common electrode 320. Accordingly, the photoelectric conversion efficiency of the photosensor 300, while lowering a dark current, may improve electrical characteristics.

On the first, second and third light emitting elements 210, 220, and 230 and the photosensor 300, the encapsulation layer 50 is formed. The encapsulation layer 50 may include, for example, a glass plate, a metal thin film, an organic layer, an inorganic layer, an organic/inorganic layer, or any combination thereof. The organic layer may include, for example, an acrylic resin, a (meth)acrylic resin, polyisoprene, a vinyl resin, an epoxy resin, a urethane resin, a cellulose resin, a perylene resin, or any combination thereof, but is not limited thereto. The inorganic layer may include, for example, oxide, nitride, and/or oxynitride, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic/inorganic layer may include, for example, polyorganosiloxane but is not limited thereto. The encapsulation layer 50 may have one layer or two or more layers.

As described above, the sensor-embedded display panel 1000 according to some example embodiments includes the first, second, and third light emitting elements 210, 220, and 230 configured to emit light in a particular (or, alternatively, predetermined) wavelength spectrum to display colors, and the photosensor 300 configured to absorb light reflected by the recognition target 40 and convert the absorbed light into an electrical signal, in the same plane on the substrate 110, thereby performing a display function and a recognition function (e.g., biometric recognition function). Accordingly, unlike conventional display panels formed outside the display panel or formed under the display panel by manufacturing the sensor as a separate module, the sensor-embedded display panel 1000 may provide improved performance without increasing the thickness, thereby implementing a slim-type high performance sensor-embedded display panel 1000.

In addition, since the photosensor 300 uses (e.g., absorbs, photoelectrically converts, etc.) light emitted from the first, second, and third light emitting elements 210, 220, and 230, a recognition function (e.g., biometric recognition function) may be performed without a separate light source. Therefore, it is not necessary to provide a separate light source outside the display panel, thereby reducing or preventing a decrease in the aperture ratio of the display panel due to the area occupied by the light source, and at the same time saving power consumed by the separate light source to improve power consumption.

In addition, as described above, the first, second, and third light emitting elements 210, 220, and 230 and the photosensor 300 share a common electrode 320 (e.g., include separate portions of a common electrode 320 that is a single piece of material), a first common auxiliary layer 340 (e.g., include separate portions of a first common auxiliary layer 340 that is a single piece of material), and a second common auxiliary layer 350 (e.g., include separate portions of a second common auxiliary layer 350 that is a single piece of material), and thus the structure and process may be simplified compared with the case where the first, second, and third light emitting elements 210, 220, and 230 and the photosensor 300 are formed in separate processes.

In addition, as described above, the photosensor 300 may be an organic photoelectric conversion diode including an organic photoelectric conversion layer. Accordingly, since the photosensor 300 has a light absorbance that is twice or more higher than that of an inorganic diode such as a silicon photodiode, it may have a high sensitivity sensing function with a thinner thickness.

In addition, as described above, the photoelectric conversion layer 330 of the photosensor 300 has a structure in which a first n-type semiconductor layer 330$p$, a second n-type semiconductor layer 330$q$, and a p-type semiconductor layer 330$r$ having different optical and electrical characteristics are stacked, thereby preventing deterioration of electrical characteristics that may occur in a structure sharing the light emitting elements 210, 220, and 230 and the first common auxiliary layer 340, and improving optical and electrical characteristics of the photosensor 300.

In addition, as described above, since the photoelectric conversion layer 330 of the photosensor 300 may include the p-type semiconductor layer 330$r$ having wavelength selectivity, the sensitivity to light in any one of the red wavelength spectrum, green wavelength spectrum, or blue wavelength spectrum is selectively increased and the color separation characteristics may be improved without the wavelength spectrum mixing. Accordingly, the sensor-embedded display panel 1000 may additionally be configured to implement an anti-spoofing effect in addition to the above-described effects, thereby enhancing the color separation characteristics of the light reflected by the recognition target 40 to further increase details of the shape of the recognition target 40, thereby selectively recognizing the color of the reflected light (e.g., skin color), to further increase the accuracy of the biometric recognition function.

In addition, as described above, since the photosensors 300 may be disposed anywhere in the non-display area NDA (e.g., anywhere in a portion of the sensor-embedded display panel 1000 that does not vertically overlap (e.g., in the z direction) within any light emitting elements and thus is not configured to emit light and/or display color), the photosensors 300 may be disposed at a desired location of the sensor-embedded display panel 1000 as many (e.g., as large of a quantity of photosensors 300 in the non-display area NDA) as desired. Therefore, for example, by randomly or regularly arranging/distributing a plurality of photosensors 300 over the entire area sensor-embedded display panel 1000, the biometric recognition function may be performed on any portion of the screen of an electronic device such as a mobile device and the biometric recognition function may be selectively performed only in a specific location where the biometric recognition function is required.

In some example embodiments, the photosensor 300 may be provided separately from (e.g., independently of) a sensor-embedded display panel 1000 and/or from any light emitting elements, for example as a separate component of an electronic device. For example, an electronic device, such as the electronic device 2000 shown in FIG. 6, may include a plurality of photosensors 300, as a separate at least one additional device 1340, to serve as a camera for the electronic device separately from any light emitting elements and/or display panels of the electronic device 2000.

In some example embodiments, one or both of the first common auxiliary layer 340 and/or the second common auxiliary layer 350 may be absent from the sensor-embedded display panel 1000, and the photoelectric conversion layer 330 may be understood to include a stack of the first n-type semiconductor layer 330$p$, the second n-type semiconductor layer 330$q$, and the p-type semiconductor layer 330$r$ between a pair of electrodes (e.g., pixel electrode 310 and a portion of the common electrode 320), for example a sequential stack from the common electrode 320 of a first n-type semiconductor layer 330$p$, a second n-type semiconductor layer 330$q$, and a p-type semiconductor layer 330$r$. In some example embodiments, the common electrode 320 may be replaced by a plurality of separate pixel electrodes that are each included in a separate one of the light emitting elements 210, 220, 230, and/or 240 and/or the photosensor 300 and may face a separate pixel electrode 211, 221, 231, 241, and/or 310, such that the photoelectric conversion layer 330 may be understood to include a stack of the first n-type semiconductor layer 330$p$, the second n-type semiconductor layer 330$q$, and the p-type semiconductor layer 330$r$ between a pair of electrodes that include the pixel electrode 310 and a separate electrode included in the photosensor 300.

Hereinafter, another example of the sensor-embedded display panel 1000 according to some example embodiments will be described.

Figure 4:
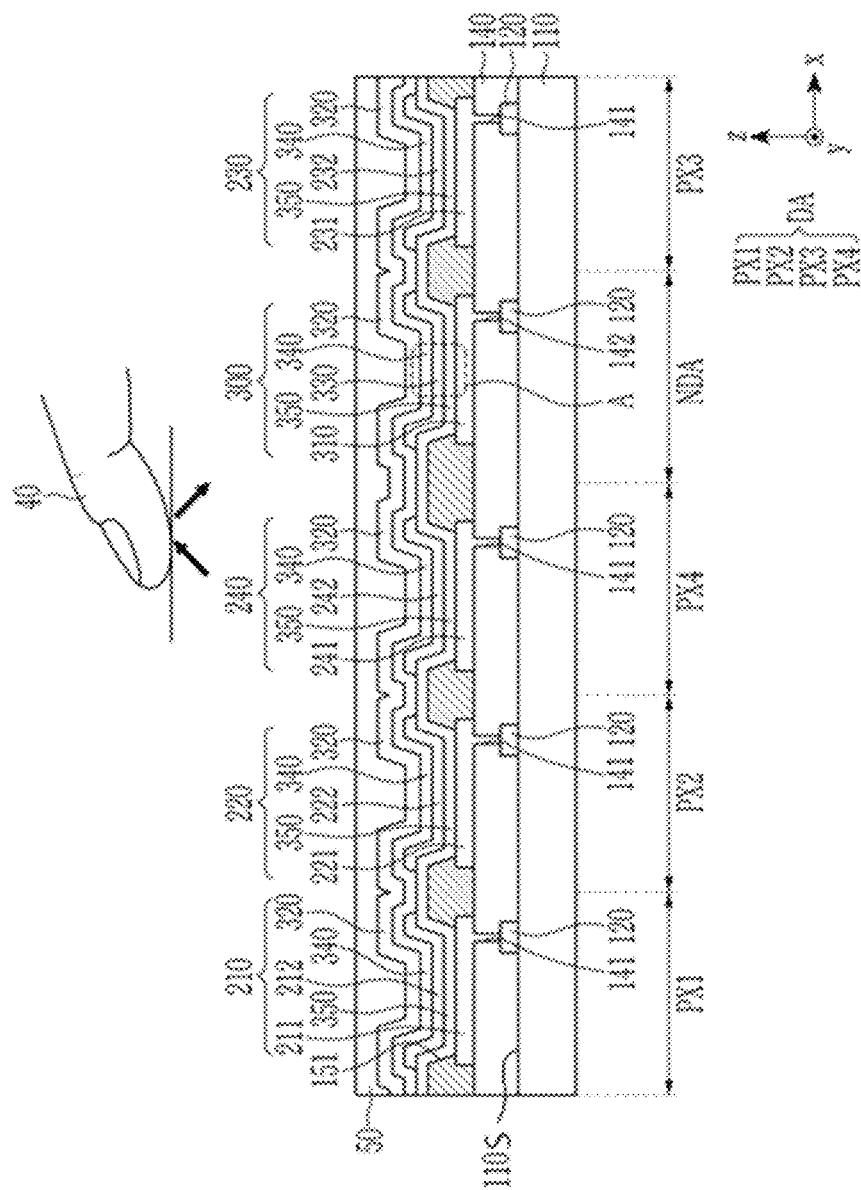
FIG. 4 is a cross-sectional view illustrating another example of a sensor-embedded display panel according to some example embodiments.

FIG. 4 is a cross-sectional view illustrating another example of a sensor-embedded display panel according to some example embodiments.

Referring to FIG. 4, a sensor-embedded display panel 1000 according to some example embodiments includes a plurality of subpixels PXs configured to display different colors, that is, a first subpixel PX1, a second subpixel PX2, and a third subpixel PX3 displaying a first color, a second color, and a third color selected from red, green, and blue, and the first subpixel PX1, the second subpixel PX2, and the third subpixel PX3 include a first light emitting element 210, a second light emitting element 220, and a third light emitting element 230, respectively, like some example embodiments, including the example embodiments shown in FIGS. 1 and 2.

However, unlike some example embodiments, including the example embodiments shown in FIGS. 1 and 2, the sensor-embedded display panel 1000 according to some example embodiments, including the example embodiments shown in FIG. 4, may include the fourth light emitting element 240 configured to emit light in an infrared wavelength spectrum. For example, the fourth light emitting element 240 may be included in a fourth subpixel PX4 adjacent to the first subpixel PX1, the second subpixel PX2, and/or the third subpixel PX3, or may be included in a non-display area, NDA. The fourth subpixel PX4 may form one unit pixel UP together with the first subpixel PX1, the second subpixel PX2, and the third subpixel PX3, and the unit pixel UP may be arranged repeatedly along rows and/or columns.

Descriptions of the first subpixel PX1, the second subpixel PX2, the third subpixel PX3, the first light emitting element 210, the second light emitting element 220, and the third light emitting element 230 are the same as described above.

The fourth light emitting element 240 is disposed on the substrate 110 and may be disposed on the same plane as the first, second, and third light emitting elements 210, 220, and 230 and photosensor 300. The fourth light emitting element 240 may be electrically connected to a separate thin film transistor 120 and driven independently. The fourth light emitting element 240 may have a structure in which the pixel electrode 241, the second common auxiliary layer 350, the light emitting layer 242, the first common auxiliary layer 340, and the common electrode 320 are sequentially stacked. Among them, the common electrode 320, the first common auxiliary layer 340, and the second common auxiliary layer 350 may be shared with the first, second, and third light emitting elements 210, 220, and 230, and the photosensor 300. The light emitting layer 242 may be configured to emit light in an infrared wavelength spectrum, which may have for example a maximum emission wavelength in greater than or equal to about 750 nm, about 750 nm to about 20 μm, about 780 nm to about 20 μm, about 800 nm to about 20 μm, about 750 nm to about 15 μm, about 780 nm to about 15 μm, about 800 nm to about 15 μm, about 750 nm to about 10 μm, about 780 nm to about 10 μm, about 800 nm to about 10 μm, about 750 nm to about 5 μm, about 780 nm to about 5 μm, about 800 nm to about 5 μm, about 750 nm to about 3 μm, about 780 nm to about 3 μm, about 800 nm to about 3 μm, about 750 nm to about 2 μm, about 780 nm to about 2 μm, about 800 nm to about 2 μm, about 750 nm to about 1.5 μm, about 780 nm to about 1.5 μm, or about 800 nm to about 1.5 μm.

The photosensor 300 may be configured to absorb light emitted from at least one of the first, second, third, or fourth light emitting elements 210, 220, 230, or 240 and then reflected by a recognition target 40 such as a living body or a tool, and then convert it into an electrical signal. For example, the photosensor 300 may be configured to absorb light emitted from the fourth light emitting element 240 in an infrared wavelength spectrum and then reflected by the recognition target 40, and then convert the absorbed light into an electrical signal. In this case, the p-type semiconductor layer 330r of the photoelectric conversion layer 330 of the photosensor 300 may include an organic material, an inorganic material, an organic-inorganic material, or any combination thereof configured to selectively absorb light in the infrared wavelength spectrum. For example, the photoelectric conversion layer 330 may include a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a naphthoquinone, a diquinone compound, a naphthoquinone compound, an anthraquinone compound, a squarylium compound, a rylene compound, a perylene compound, a squaraine compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or any combination thereof, but is not limited thereto.

The sensor-embedded display panel 1000 according to some example embodiments, including the example embodiments shown in FIG. 4, includes the fourth light emitting element 240 configured to emit light in the infrared wavelength spectrum and the photosensor 300 configured to absorb light in the infrared wavelength spectrum. Therefore, in addition to the recognition function (biometric recognition function), the sensitivity of the photosensor 300 may be improved even in a low-illumination environment, and the detection capability of a 3-dimensional image may be further increased by widening a dynamic range for detailed division of black and white contrast. Accordingly, the sensing capability of the sensor-embedded display panel 1000 may be further improved. In particular, since light in the infrared wavelength spectrum may have a deeper penetration depth due to its long wavelength characteristics and information located at different distances and/or depths may be effectively obtained, images or changes in blood vessels such as veins, iris and/or face, etc., in addition to fingerprints may be effectively detected, and the scope of application may be further expanded.

The aforementioned sensor-embedded display panel 1000 may be applied to electronic devices such as various display devices. Electronic devices such as display devices may be applied to, for example, mobile phones, video phones, smart phones, mobile phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but are not limited thereto.

Figure 5:
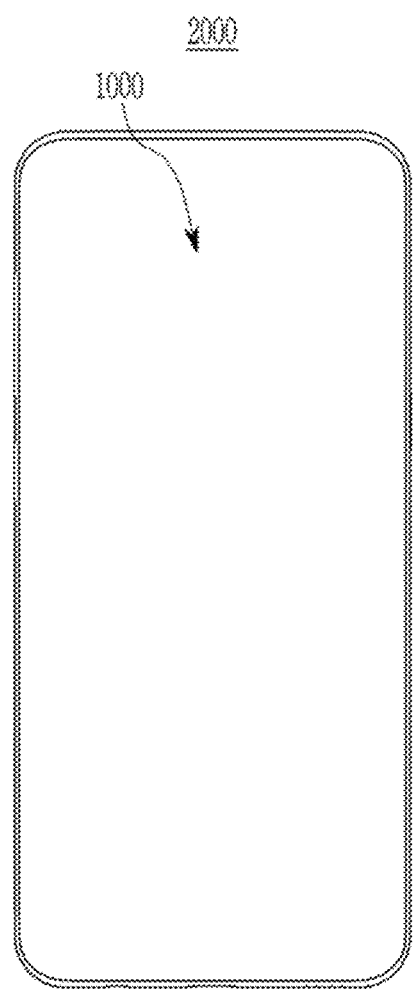
FIG. 5 is a schematic diagram illustrating an example of a smart phone as an electronic device according to some example embodiments.

FIG. 5 is a schematic view illustrating an example of a smart phone as an electronic device according to some example embodiments.

Referring to FIG. 5, the electronic device 2000 may include the aforementioned sensor-embedded display panel 1000, and the photosensor 300 on the whole or a part of the sensor-embedded display panel 1000, and thus a biometric recognition function may be performed on any part of the screen, and according to the user's selection, the biometric recognition function may be selectively performed only at a specific location where the biometric recognition function is required.

An example of a method of recognizing the recognition target 40 in an electronic device 2000 such as a display device may include, for example, driving the first, second, and third light emitting elements 210, 220, and 230 of the sensor-embedded display panel 1000 (or the first, second, third, and fourth light emitting elements 210, 220, 230, and 240) and the photosensor 300 to detect the light reflected from the recognition target 40 among the light emitted from the first, second, and third light emitting elements 210, 220, and 230 (or the first, second, third and fourth light emitting elements 210, 220, 230, and 240), in the photosensor 300; comparing the image of the recognition target 40 stored in advance with the image of the recognition target 40 detected by the photosensor 300; and judging the consistency of the compared images and if they match according to the determination that recognition of the recognition target 40 is complete, turning off the photosensor 300, permitting user's access to the display device, and driving the sensor-embedded display panel 1000 to display an image.

Figure 6:
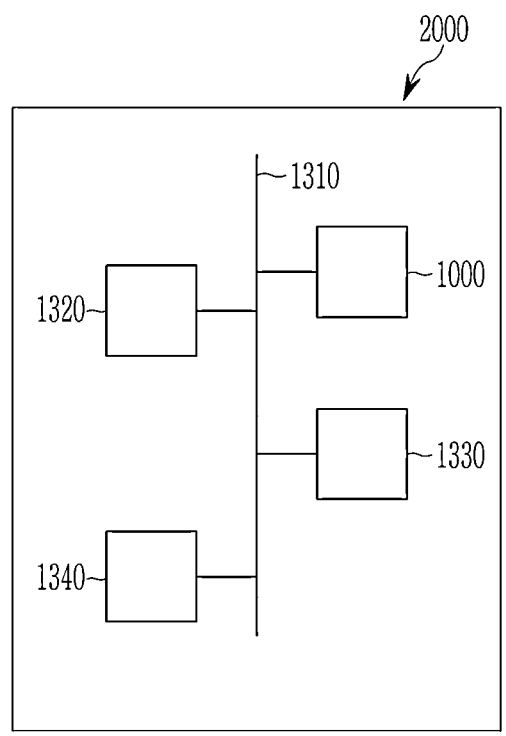
FIG. 6 is a schematic diagram illustrating an example of a configuration diagram of an electronic device according to some example embodiments.

FIG. 6 is a schematic view illustrating an example of a configuration view of an electronic device according to some example embodiments.

Referring to FIG. 6, in addition to the aforementioned constituent elements (e.g., the sensor-embedded display panel 1000), the electronic device 2000 may further include a bus 1310, a processor 1320, a memory 1330, and at least one additional device 1340. Information of the aforementioned sensor-embedded display panel 1000, processor 1320, memory 1330, and at least one additional device 1340 may be transmitted to each other through the bus 1310. In some example embodiments, the at least one additional device 1340 may be omitted. In some example embodiments, the sensor-embedded display panel 1000 may be replaced by a display device including, for example, exclusively light emitting elements and no light absorption sensors, while the at least one additional device 1340 may include one or a plurality (e.g., an array) of photosensors according to any of the example embodiments which may serve as a biometric sensor, a camera, or the like.

The processor 1320 may include one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may control, for example, a display operation of the sensor-embedded display panel 1000 or a sensor operation of the photosensor 300.

The memory 1330 may be a non-transitory computer readable storage medium, such as, for example, as a solid state drive (SSD) and may store an instruction program (e.g., program of instructions), and the processor 1320 may perform a function related to the sensor-embedded display panel 1000 by executing the stored instruction program.

The at least one additional device 1340 may include one or more communication interfaces (e.g., wireless communication interfaces, wired interfaces), user interfaces (e.g., keyboard, mouse, buttons, etc.), power supply and/or power supply interfaces, or any combination thereof.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to any of the example embodiments may be recorded in a non-transitory computer readable storage device including program instructions for implementing various operations of the aforementioned example embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of any of the example embodiments.

Hereinafter, some example embodiments are illustrated in more detail with reference to examples. However, the present scope of the inventive concepts is not limited to these examples.

Manufacture of Photosensor

Example 1

Al (10 nm), ITO (100 nm), and Al (8 nm) are sequentially deposited on a glass substrate to form a lower electrode of an Al/ITO/Al structure. Subsequently, N,N'-bis(3-methylphenyl)-N,N'-diphenyl-[1,1-biphenyl]-4,4'-diamine is formed on the lower electrode to form a hole auxiliary layer (HOMO: 5.3 eV to 5.6 eV, LUMO: 2.0 eV to 2.3 eV). Then, a p-type semiconductor represented by Compound A (HOMO: 5.6 eV, LUMO: 3.52 eV) is deposited on the hole auxiliary layer to form a 10 nm-thick p-type semiconductor layer, fullerene (C60, HOMO: 6.40 eV, LUMO: 4.23 eV) is deposited thereon to form a 5 nm-thick lower n-type semiconductor layer, and an n-type semiconductor represented by Compound B (Tokyo Chemical Industry Co., Ltd.) is deposited thereon to form a 30 nm-thick upper n-type semiconductor layer (HOMO: 6.31 eV, LUMO: 3.27 eV). Then, 4,7-diphenyl-1,10-phenanthroline is deposited on the upper n-type semiconductor layer to form an electron auxiliary layer (HOMO: 6.1 eV to 6.4 eV, LUMO: 2.9 eV to 3.2 eV). Then, magnesium and silver are deposited on the electron auxiliary layer to form a Mg:Ag upper electrode, manufacturing a photosensor.

[Compound A]

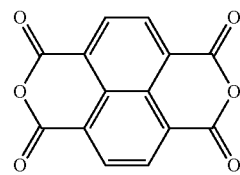

[compound B]

Comparative Example 1

A photosensor is manufactured in the same manner as Example 1 except that the lower n-type semiconductor layer is formed to be 35 nm thick without the upper n-type semiconductor layer.

Comparative Example 2

A photosensor is manufactured in the same manner as Example 1 except that the upper n-type semiconductor layer is formed to be 35 nm thick without the lower n-type semiconductor layer.

Comparative Example 3

A photosensor is manufactured in the same manner as Example 1 except that Compound A and C60 in a volume ratio (thickness ratio) of 1:4 are co-deposited to form a 45 nm-thick photoelectric conversion layer instead of the p-type semiconductor layer, the upper n-type semiconductor layer, and the lower n-type semiconductor layer.

Evaluation I

The photoelectric conversion efficiency of the photosensors according to the Examples and Comparative Examples is evaluated.

The photoelectric conversion efficiency is evaluated from the external quantum efficiency (EQE), and the external quantum efficiency (EQE) may be evaluated from external quantum efficiency (EQE) at a maximum absorption wavelength ($\lambda$max) in a wavelength region of 400 nm to 700 nm by adopting an IPCE (Incident Photon to Current Efficiency) method.

Figure 7:
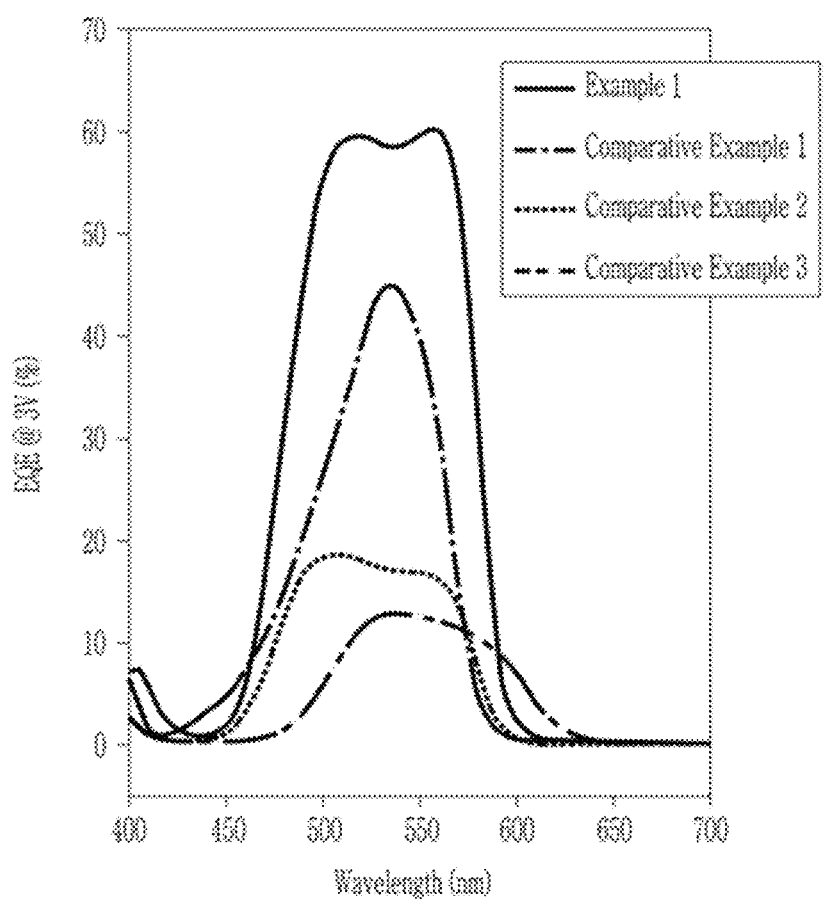
FIG. 7 is a graph showing external quantum efficiency (EQE) according to the wavelength of the photosensor according to Example 1 and Comparative Examples 1 to 3 according to some example embodiments.

The results are shown in FIG. 7 and Table 1.

FIG. 7 is a graph showing external quantum efficiency (EQE) according to wavelengths of the photosensors according to Example 1 and Comparative Examples 1 to 3.

TABLE 1

|  | EQE (%) (@$\lambda_{max}$) |
|---|---|
| Example 1 | 60.2 |
| Comparative Example 1 | 45.1 |
| Comparative Example 2 | 18.7 |
| Comparative Example 3 | 12.8 |

Referring to FIG. 7 and Table 1, the photosensor according to Example 1 exhibited improved photoelectric conversion efficiency in the green wavelength spectrum (green wavelength region) compared with the photosensors according to the Comparative Examples.

Evaluation II

The photosensors according to Examples and Comparative Examples are evaluated with respect to dark currents under a reverse bias voltage.

The dark currents are measured by dark current density, which is obtained by measuring a dark current with a current-voltage evaluation equipment (Keithley K4200 parameter analyzer) and dividing it by a unit pixel area (0.04 cm$^2$), wherein the dark current density is evaluated from a current flowing when a reverse bias of −3 V is applied thereto.

The results are shown in Table 2.

TABLE 2

|  | Dark current (mA/cm$^2$) |
|---|---|
| Example 1 | $6.5 \times 10^{-6}$ |
| Comparative Example 1 | $1.4 \times 10^{-5}$ |
| Comparative Example 2 | $3.5 \times 10^{-5}$ |
| Comparative Example 3 | $4.7 \times 10^{-5}$ |

Referring to Table 2, the photosensors according to the Examples (e.g., Example 1) exhibited a low dark current when the reverse bias is applied thereto, compared with the photosensors according to Comparative Examples.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A sensor-embedded display panel, comprising:
   a substrate;
   a light emitting element on the substrate, the light emitting element including a light emitting layer; and
   a photosensor on the substrate, the photosensor including
      a photoelectric conversion layer that is in parallel with the light emitting layer along an in-plane direction of the substrate such that the photoelectric conversion layer and the light emitting layer at least partially overlap in the in-plane direction,
   wherein the light emitting element and the photosensor each include
      a separate portion of a first common auxiliary layer that is a single piece of material that extends continuously on both the light emitting layer and the photoelectric conversion layer, and
      a separate portion of a common electrode that is on the first common auxiliary layer and is configured to apply a common voltage to both the light emitting element and the photosensor, and
   wherein the photoelectric conversion layer includes a sequential stack from the first common auxiliary layer of
      a first n-type semiconductor layer,
      a second n-type semiconductor layer, and
      a p-type semiconductor layer.

2. The sensor-embedded display panel of claim 1, wherein the light emitting element comprises first, second and third light emitting elements arranged in parallel along the in-plane direction of the substrate such that the first, second and third light emitting elements at least partially overlap in the in-plane direction, wherein the first, second and third light emitting elements are configured to emit light of different emission spectra in relation to each other, and
   the photosensor is configured to convert light emitted from at least one of the first, second, or third light emitting elements and then reflected by a recognition target to an electrical signal.

3. The sensor-embedded display panel of claim 1, wherein the photoelectric conversion layer is configured to absorb light in a red wavelength spectrum, a green wavelength spectrum, a blue wavelength spectrum, or any combination thereof.

4. The sensor-embedded display panel of claim 1, wherein at least one of the first n-type semiconductor layer or the second n-type semiconductor layer forms a pn junction with the p-type semiconductor layer.

5. The sensor-embedded display panel of claim 1, wherein one of the first n-type semiconductor layer or the second n-type semiconductor layer comprises an n-type semiconductor configured to absorb light of a visible light wavelength spectrum, and
another one of the first n-type semiconductor layer or the second n-type semiconductor layer comprises a transparent n-type semiconductor.

6. The sensor-embedded display panel of claim 1, wherein a lowest unoccupied molecular orbital (LUMO) energy level of the first n-type semiconductor layer is closer to a vacuum level of 0 eV than a LUMO energy level of the second n-type semiconductor layer.

7. The sensor-embedded display panel of claim 6, wherein a difference between the LUMO energy level of the first n-type semiconductor layer and a LUMO energy level of the first common auxiliary layer is smaller than a difference between the LUMO energy level of the second n-type semiconductor layer and the LUMO energy level of the first common auxiliary layer.

8. The sensor-embedded display panel of claim 7, wherein the difference between the LUMO energy level of the first n-type semiconductor layer and the LUMO energy level of the first common auxiliary layer is about 0 eV to about 1.0 eV.

9. The sensor-embedded display panel of claim 7, wherein the difference between the LUMO energy level of the second n-type semiconductor layer and the LUMO energy level of the first common auxiliary layer is about 0.5 eV to about 1.2 eV.

10. The sensor-embedded display panel of claim 6, wherein a difference between the LUMO energy level of the second n-type semiconductor layer and the LUMO energy level of the first n-type semiconductor layer is about 0.5 eV to about 1.2 eV.

11. The sensor-embedded display panel of claim 1, wherein a thickness of the second n-type semiconductor layer is smaller than a thickness of the first n-type semiconductor layer.

12. The sensor-embedded display panel of claim 11, wherein the thickness of the second n-type semiconductor layer is about 1 nm to about 10 nm.

13. The sensor-embedded display panel of claim 1, wherein
the light emitting element comprises first, second, and third light emitting elements that are each configured to emit light of any one of a red wavelength spectrum, a green wavelength spectrum, a blue wavelength spectrum, or an infrared wavelength spectrum, and
the p-type semiconductor layer comprises a p-type semiconductor configured to selectively absorb light of any one of the red wavelength spectrum, the green wavelength spectrum, the blue wavelength spectrum, or the infrared wavelength spectrum.

14. The sensor-embedded display panel of claim 1, wherein
the first n-type semiconductor layer comprises a transparent n-type semiconductor, and
the second n-type semiconductor layer comprises an n-type semiconductor configured to absorb light of a visible light wavelength spectrum, and
the p-type semiconductor layer comprises a p-type semiconductor configured to selectively absorb light of any one of a red wavelength spectrum, a green wavelength spectrum, or a blue wavelength spectrum.

15. The sensor-embedded display panel of claim 1, further comprising a second common auxiliary layer that is a single piece of material that extends continuously between the light emitting element and the substrate and between the photosensor and the substrate.

16. The sensor-embedded display panel of claim 2, wherein
the sensor-embedded display panel comprises
a display area configured to display a color, and
a non-display area excluding the display area
wherein the photosensor is in the non-display area.

17. The sensor-embedded display panel of claim 16, wherein
the display area comprises
a plurality of first subpixels configured to display red and comprising the first light emitting element,
a plurality of second subpixels configured to display green and comprising the second light emitting element, and
a plurality of third subpixels configured to display blue and comprising the third light emitting element, and
the photosensor is between at least two of a first subpixel of the plurality of first subpixels, a second subpixel of the plurality of second subpixels, or a third subpixel of the plurality of third subpixels in the in-plane direction.

18. The sensor-embedded display panel of claim 1, wherein
the light emitting layer comprises an organic light emitting material, a quantum dot, perovskite, or any combination thereof, and
the photoelectric conversion layer comprises an organic photoelectric conversion material.

19. A sensor-embedded display panel, comprising:
a display area configured to display a color and a non-display area excluding the display area,
wherein the display area includes
a first subpixel configured to display a first color and including a first light emitting element,
a second subpixel configured to display a second color and including a second light emitting element, and
a third subpixel configured to display a third color and including a third light emitting element,
wherein the non-display area includes a photosensor that is between at least two of the first subpixel, the second subpixel, or the third subpixel,
wherein the first light emitting element, the second light emitting element, the third light emitting element, and the photosensor share a common electrode that is configured to apply a common voltage to the first light emitting element, the second light emitting element, the third light emitting element, and the photosensor, and
wherein the photosensor includes
a separate portion of the common electrode,
a pixel electrode facing the separate portion of the common electrode, and
a photoelectric conversion layer that includes a stack of a first n-type semiconductor layer, a second n-type semiconductor layer, and a p-type semiconductor layer, wherein the photoelectric conversion layer is between the common electrode and the pixel electrode.

20. The sensor-embedded display panel of claim 19, wherein
the first n-type semiconductor layer and the second n-type semiconductor layer each comprise different materials in relation to each other, and the stack is a sequential stack of the first n-type semiconductor layer, the second n-type semiconductor layer, and the p-type semiconductor layer.

21. The sensor-embedded display panel of claim 19, wherein a lowest unoccupied molecular orbital (LUMO) energy level of the first n-type semiconductor layer is closer to a vacuum level of 0 eV than a LUMO energy level of the second n-type semiconductor layer.

22. The sensor-embedded display panel of claim 19, wherein
the first light emitting element, the second light emitting element, the third light emitting element, and the photosensor share a first common auxiliary layer that is under the common electrode,
the first light emitting element includes a first light emitting layer, the second light emitting element includes a second light emitting layer, and the third light emitting element includes a third light emitting layer, and
the first light emitting element, the second light emitting element, the third light emitting element, and the photosensor share a second common auxiliary layer that is facing the first common auxiliary layer, wherein the first light emitting layer, the second light emitting layer, the third light emitting layer, and the photoelectric conversion layer are between the first common auxiliary layer and the second common auxiliary layer.

23. The sensor-embedded display panel of claim 22, wherein a difference between a LUMO energy level of the first n-type semiconductor layer and a LUMO energy level of the first common auxiliary layer is smaller than a difference between a LUMO energy level of the second n-type semiconductor layer and the LUMO energy level of the first common auxiliary layer.

24. The sensor-embedded display panel of claim 23, wherein
the difference between the LUMO energy level of the first n-type semiconductor layer and the LUMO energy level of the first common auxiliary layer is about 0 eV to about 1.0 eV,
the difference between the LUMO energy level of the second n-type semiconductor layer and the LUMO energy level of the first common auxiliary layer is about 0.5 eV to about 1.2 eV, and
a difference between the LUMO energy level of the second n-type semiconductor layer and the LUMO energy level of the first n-type semiconductor layer is about 0.5 eV to about 1.2 eV.

25. The sensor-embedded display panel of claim 19, wherein
a thickness of the second n-type semiconductor layer is smaller than a thickness of the first n-type semiconductor layer, and
the thickness of the second n-type semiconductor layer is about 1 nm to about 10 nm.

26. The sensor-embedded display panel of claim 1, wherein
the first n-type semiconductor layer comprises a transparent n-type semiconductor,
the second n-type semiconductor layer comprises an n-type semiconductor configured to absorb light of a visible light wavelength spectrum, and
the p-type semiconductor layer comprises a p-type semiconductor configured to selectively absorb light of any one of a red wavelength spectrum, a green wavelength spectrum, a blue wavelength spectrum, or an infrared wavelength spectrum.

27. A display device comprising the sensor-embedded display panel of claim 1.

28. A display device comprising the sensor-embedded display panel of claim 19.

29. A photosensor, comprising:
a pair of electrodes; and
a photoelectric conversion layer between the pair of electrodes, wherein the photoelectric conversion layer includes a stack of a first n-type semiconductor layer, a second n-type semiconductor layer, and a p-type semiconductor layer between the pair of electrodes,
wherein one of the first n-type semiconductor layer or the second n-type semiconductor layer comprises an n-type semiconductor configured to absorb light of a visible light wavelength spectrum, and
wherein another one of the first n-type semiconductor layer or the second n-type semiconductor layer comprises a transparent n-type semiconductor.

30. The photosensor of claim 29, wherein a thickness of the second n-type semiconductor layer is smaller than a thickness of the first n-type semiconductor layer.

31. The photosensor of claim 30, wherein the thickness of the second n-type semiconductor layer is about 1 nm to about 10 nm.

32. An electronic device comprising the photosensor of claim 29.

33. A sensor-embedded display panel, comprising:
a substrate;
a light emitting element on the substrate, the light emitting element including a light emitting layer; and
the photosensor of claim 29 on the substrate, wherein the photoelectric conversion layer of the photosensor is arranged in parallel with the light emitting layer along an in-plane direction of the substrate such that the photoelectric conversion layer and the light emitting layer at least partially overlap in the in-plane direction,
wherein the photoelectric conversion layer is configured to absorb light of a red wavelength spectrum, a green wavelength spectrum, a blue wavelength spectrum, or any combination thereof.

* * * * *